United States Patent
Liao et al.

(10) Patent No.: US 11,646,395 B2
(45) Date of Patent: May 9, 2023

(54) HIGH EFFICIENCY ULTRAVIOLET LIGHT EMITTING DIODE WITH ELECTRON TUNNELLING

(71) Applicant: Trustees of Boston University, Boston, MA (US)

(72) Inventors: Yitao Liao, Redwood City, CA (US); Theodore D. Moustakas, Dover, MA (US)

(73) Assignee: Trustees of Boston University, Boston, MA (US)

( * ) Notice: Subject to any disclaimer, the term of this patent is extended or adjusted under 35 U.S.C. 154(b) by 261 days.

(21) Appl. No.: 16/723,966

(22) Filed: Dec. 20, 2019

(65) Prior Publication Data

US 2020/0287084 A1 Sep. 10, 2020

Related U.S. Application Data

(63) Continuation of application No. 14/681,327, filed on Apr. 8, 2015, now Pat. No. 10,535,801, which is a
(Continued)

(51) Int. Cl.
*H01L 33/32* (2010.01)
*H01L 21/02* (2006.01)
(Continued)

(52) U.S. Cl.
CPC .......... *H01L 33/32* (2013.01); *H01L 21/0237* (2013.01); *H01L 21/0242* (2013.01);
(Continued)

(58) Field of Classification Search
CPC . H01L 33/145; H01L 33/0075; H01L 33/007; H01L 33/06; H01L 33/32;
(Continued)

(56) References Cited

U.S. PATENT DOCUMENTS

| 4,727,341 A | 2/1988 | Nishi et al. |
| 5,057,881 A | 10/1991 | Lobentanzer et al. |

(Continued)

FOREIGN PATENT DOCUMENTS

| CN | 1659715 A | 8/2005 |
| DE | 112005002133 | 8/2007 |

(Continued)

OTHER PUBLICATIONS

Jmerik et al. AlGaN-based Quantum-Well Heterostructures for Deep Ultraviolet Light-Emitting Diodes Grown by Submonolayer Discrete Plasma-assisted Molecular-Beam Epitaxy, 2008 (Year: 2008).*

(Continued)

*Primary Examiner* — Lauren R Bell
(74) *Attorney, Agent, or Firm* — Burns & Levinson LLP; Steven M. Mills

(57) ABSTRACT

A method of growing an AlGaN semiconductor material utilizes an excess of Ga above the stoichiometric amount typically used. The excess Ga results in the formation of band structure potential fluctuations that improve the efficiency of radiative recombination and increase light generation of optoelectronic devices, in particular ultraviolet light emitting diodes, made using the method. Several improvements in UV LED design and performance are also provided for use together with the excess Ga growth method. Devices made with the method can be used for water purification, surface sterilization, communications, and data storage and retrieval.

10 Claims, 23 Drawing Sheets

Related U.S. Application Data continuation of application No. 13/646,038, filed on Oct. 5, 2012, now Pat. No. 9,627,580, which is a continuation of application No. PCT/US2011/034724, filed on May 2, 2011.

(60) Provisional application No. 61/329,947, filed on Apr. 30, 2010.

(51) Int. Cl.
  *H01L 33/00* (2010.01)
  *H01L 33/06* (2010.01)
  *H01L 33/02* (2010.01)

(52) U.S. Cl.
  CPC ...... *H01L 21/0254* (2013.01); *H01L 21/0259* (2013.01); *H01L 21/02458* (2013.01); *H01L 21/02507* (2013.01); *H01L 21/02573* (2013.01); *H01L 21/02625* (2013.01); *H01L 33/007* (2013.01); *H01L 33/06* (2013.01); *H01L 33/025* (2013.01)

(58) Field of Classification Search
  CPC ............... H01L 33/025; H01L 21/0259; H01L 21/02625; H01L 21/02458; H01L 21/0242; H01L 21/02507; H01L 21/0254; H01L 21/0237; H01L 21/02573; H01L 33/04
  See application file for complete search history.

(56) References Cited

U.S. PATENT DOCUMENTS

| | | | |
|---|---|---|---|
| 5,132,981 A | 7/1992 | Uomi et al. | |
| 5,253,264 A | 10/1993 | Suzuki et al. | |
| 5,287,377 A | 2/1994 | Fukuzawa et al. | |
| 5,392,306 A | 2/1995 | Usami et al. | |
| 5,471,335 A | 11/1995 | Nitta | |
| 5,523,589 A | 6/1996 | Edmond et al. | |
| 5,625,635 A | 4/1997 | Kurtz et al. | |
| 5,747,827 A | 5/1998 | Duggan et al. | |
| 5,932,896 A | 8/1999 | Sugiura et al. | |
| 6,437,361 B1 | 8/2002 | Matsuda | |
| 6,566,688 B1 | 5/2003 | Zhang et al. | |
| 6,677,619 B1 | 1/2004 | Nagahama et al. | |
| 7,345,324 B2 | 3/2008 | Bour et al. | |
| 7,498,182 B1 * | 3/2009 | Sampath | B82Y 20/00 438/21 |
| 10,535,801 B2 * | 1/2020 | Liao | H01L 21/02458 |
| 2001/0024312 A1 | 9/2001 | Lee | |
| 2001/0030317 A1 | 10/2001 | Lee et al. | |
| 2003/0006418 A1 | 1/2003 | Emerson et al. | |
| 2004/0051107 A1 | 3/2004 | Nagahama | |
| 2004/0070810 A1 | 4/2004 | Yu et al. | |
| 2004/0140531 A1 | 7/2004 | Werner et al. | |
| 2005/0110031 A1 | 5/2005 | Lai et al. | |
| 2005/0211971 A1 | 9/2005 | Okumura | |
| 2005/0230701 A1 | 10/2005 | Huang | |
| 2005/0236627 A1 | 10/2005 | Kim et al. | |
| 2005/0242357 A1 | 11/2005 | Uematsu et al. | |
| 2007/0051937 A1 | 3/2007 | Kishino et al. | |
| 2007/0051939 A1 | 3/2007 | Nakahara et al. | |
| 2007/0069234 A1 * | 3/2007 | Won | H01L 33/06 257/103 |
| 2007/0075307 A1 | 4/2007 | Yoon et al. | |
| 2007/0080369 A1 | 4/2007 | Sakai | |
| 2007/0181895 A1 | 8/2007 | Nagai | |
| 2007/0272936 A1 | 11/2007 | Shin | |
| 2008/0081390 A1 | 4/2008 | Gaska et al. | |
| 2008/0083970 A1 | 4/2008 | Kamber et al. | |
| 2008/0099755 A1 | 5/2008 | Tansu et al. | |
| 2008/0157102 A1 | 7/2008 | Hori et al. | |
| 2009/0026440 A1 | 1/2009 | Kyono et al. | |
| 2009/0045392 A1 | 2/2009 | Park et al. | |
| 2009/0206320 A1 | 8/2009 | Chua et al. | |
| 2009/0272963 A1 | 11/2009 | Sakamoto et al. | |
| 2009/0278113 A1 | 11/2009 | Chung et al. | |
| 2009/0302308 A1 | 12/2009 | Chua et al. | |
| 2010/0019223 A1 | 1/2010 | Kang et al. | |
| 2010/0181583 A1 | 7/2010 | Peter et al. | |
| 2010/0187496 A1 | 7/2010 | Yan | |
| 2010/0270532 A1 | 10/2010 | Takano et al. | |
| 2011/0042643 A1 | 2/2011 | Stauss et al. | |
| 2011/0101301 A1 | 5/2011 | Lin et al. | |
| 2011/0187294 A1 | 8/2011 | Bergmann et al. | |
| 2011/0198664 A1 * | 8/2011 | Kang | H01L 33/14 257/100 |
| 2012/0007040 A1 | 1/2012 | Moon et al. | |
| 2012/0138890 A1 | 6/2012 | Shioda et al. | |
| 2012/0161103 A1 | 6/2012 | Peter et al. | |
| 2012/0217471 A1 | 8/2012 | Shioda et al. | |
| 2013/0069034 A1 | 3/2013 | Hirayama | |

FOREIGN PATENT DOCUMENTS

| | | |
|---|---|---|
| JP | 4375497 B1 | 12/2009 |
| TW | 200303105 A1 | 3/2007 |
| TW | 200924245 A | 6/2009 |
| TW | 201007999 A | 2/2010 |
| WO | 2009039830 A1 | 4/2009 |

OTHER PUBLICATIONS

Sze et al. (2007). 1.5.7 Tunneling. In Physics of semiconductor devices. Wiley-Interscience. (Year: 2007).*
AlGaN based deep ultraviolet light emitting diodes with high internal quantum efficiency grown by molecular beam epitaxy Liao, Yitao and Thomidis, Christos and Kao, Chen-kai and Moustakas, Theodore D., Applied Physics Letters, 98, 081110 (2011), DOI:http://dx.doi.org/10.1063/1.3559842.
Bhattacharyya et al., "Deep Ultraviolet Emitting AlGaN Quantum Wells with High Internal Quantum Efficiency", Applied Physics Letters 94, 2009.
CN 201180021530.9 based on PCT/US11/34724, First OA dated Dec. 17, 2014, 23 pages.
CN Application No. 201510631688.8 "Second Office Action" dated Apr. 3, 2018. No new refs cited.
CN Application No. 201510631688.8, "First Office Action", dated Jul. 27, 2017.
Dollins et al., "Enhanced room-temperature luminescence efficiency through carrier localization in $Al_{sub x}Ga_{sub 1-x}N$", Applied Physics Letters 86, 031916 (2005), 4 pages.
Fox, et al., "Quantum Wells, Superlattices, and Band-Gap Engineering", Springer Handbook of Electronic and Photonic Materials, (2007): pp. 1021-1040 (Retrieved from http://static.springer.com/sqw/documents/171747/application/pdf/978038726-0594-c1.pdf and also available at http://linkspringer.com/book/10.1007/978-0-387-29185-7).
Jmerik et al. AlGaN-based quantum-well heterostructures for deep ultraviolet light-emitting diodes grown by submonolayer discrete plasma-assisted molecular-beam epitaxy. Semiconductors, 2008, vol. 42, No. 12, pp. 1420-1426. http://dx.doi.org/10.1134/S1063782608120099.
Machine translation of WO 2009/039830.
Miller, "Optical Physics of Quantum Wells", Stanford University, 1996, pp. 1-28 (Retrieved from http://ee.stanford.edu/.about.dabm/181.pdf).
PCT/US11/34724 International Search Report and Written Opinion, dated Jan. 17, 2018, 3 pages.
TW 100115418, First Office Action dated Oct. 23, 2015, 3 pages.
TW 105129634, "Third Office Action", dated Aug. 10, 2018.
TW 105129634, 2nd Office Action dated Jan. 11, 2018.
TW Application No. 105129634, "First Office Action", dated Mar. 2, 2017.

* cited by examiner

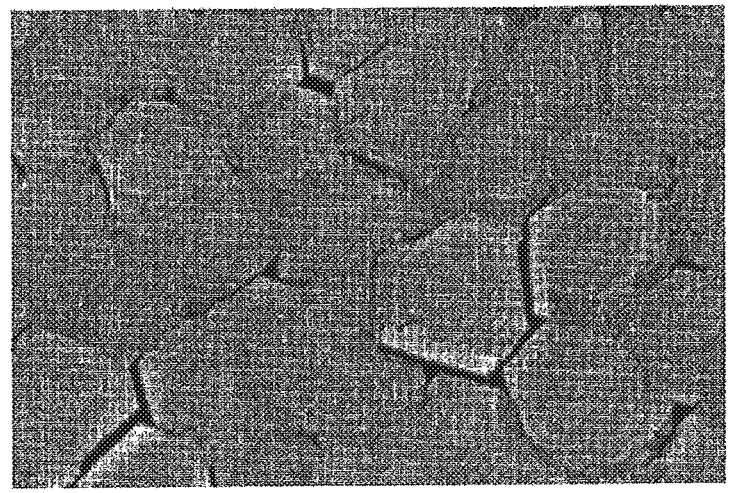
FIG. 4
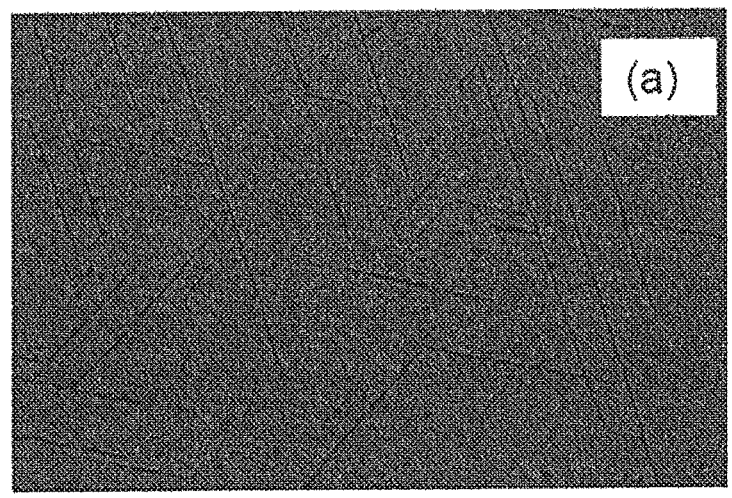
FIG. 5A
| n-Al$_{0.55}$Ga$_{0.45}$N ~ 800 nm |
| UID Al$_{0.55}$Ga$_{0.45}$N ~ 100 nm |
| HT-AlN ~ 100 nm |
| Sapphire (0001) |
FIG. 5B

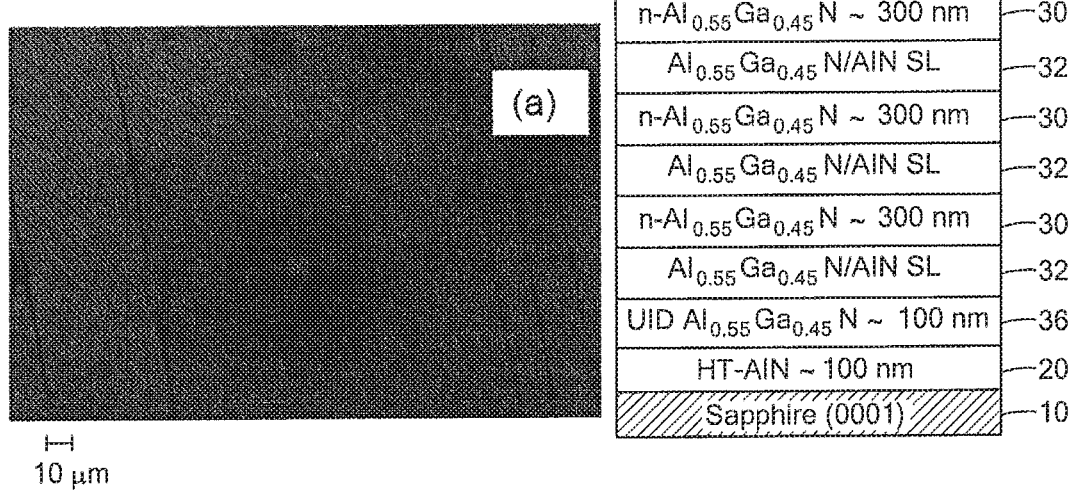
*FIG. 6A*  *FIG. 6B*
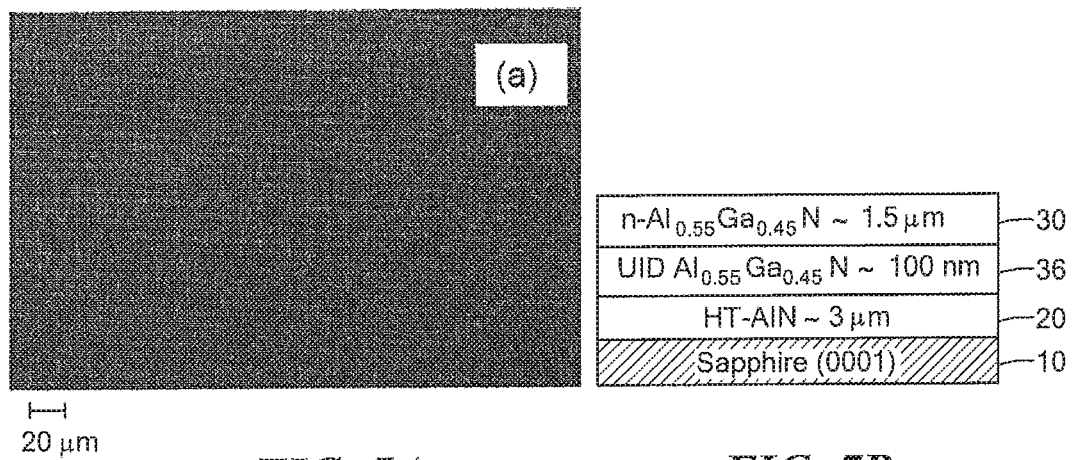
*FIG. 7A*  *FIG. 7B*

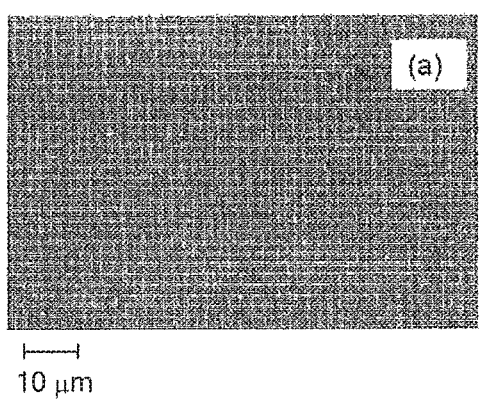
| n-Al$_{0.55}$Ga$_{0.45}$N:Si @ 1e19 cm$^{-3}$ ~300 nm | —30 |
| n-Al$_{0.55}$Ga$_{0.45}$N:Si @ 2e18 cm$^{-3}$ ~700 nm | —30 |
| n-Al$_{0.55}$Ga$_{0.45}$N:Si @ 6e17 cm$^{-3}$ ~1 µm | —30 |
| Al$_{0.55}$Ga$_{0.45}$N/AlN SL | —32 |
| UID Al$_{0.55}$Ga$_{0.45}$N ~ 100 nm | —36 |
| HT-AlN  2 µm | —20 |
| Sapphire (0001) | —10 |
*FIG. 8A*  *FIG. 8B*
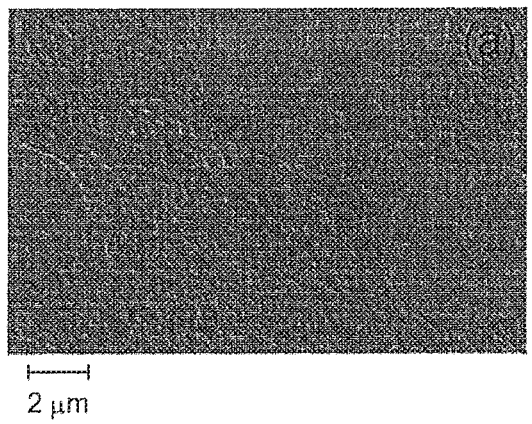
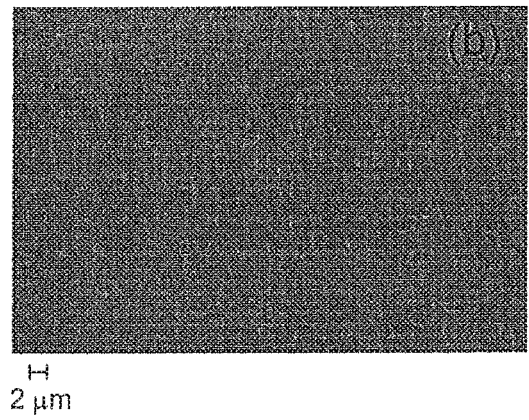
*FIG. 9A*  *FIG. 9B*

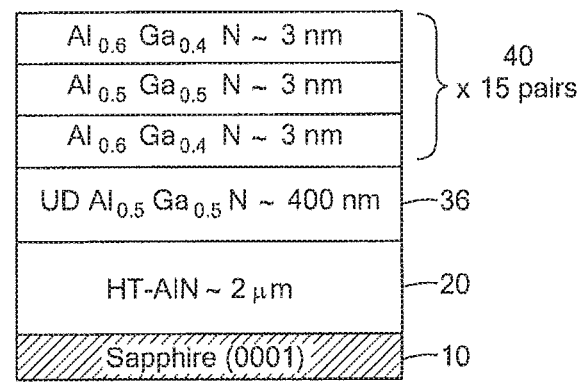
FIG. 12
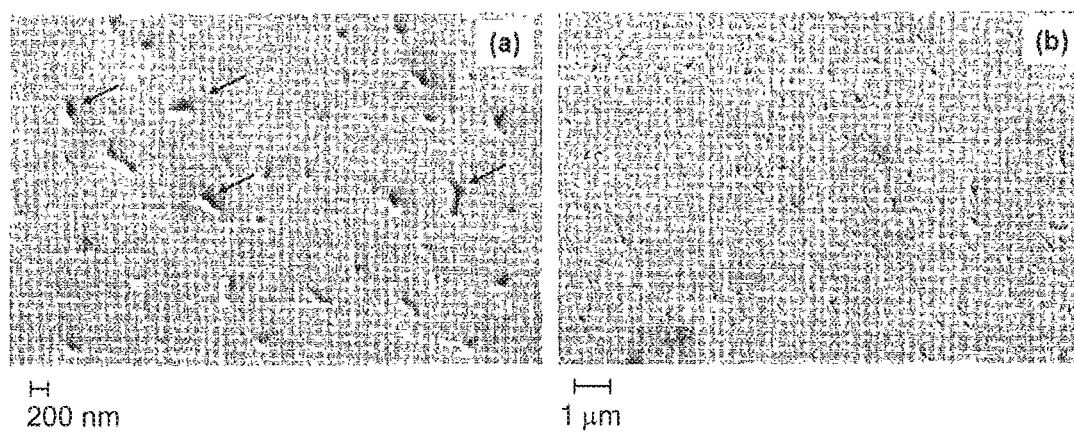
FIG. 13A     FIG. 13B

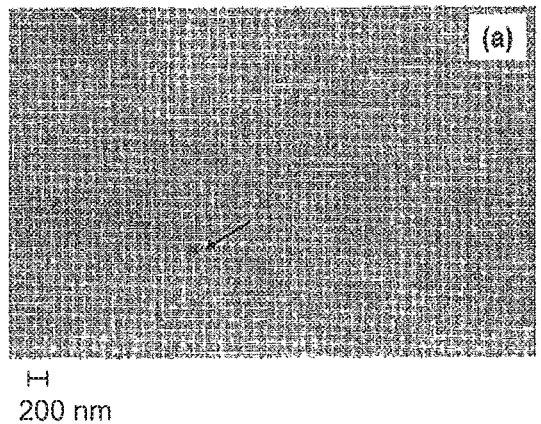 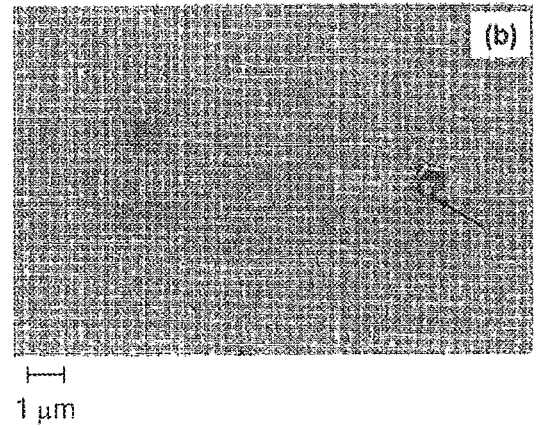
FIG. 14A  FIG. 14B
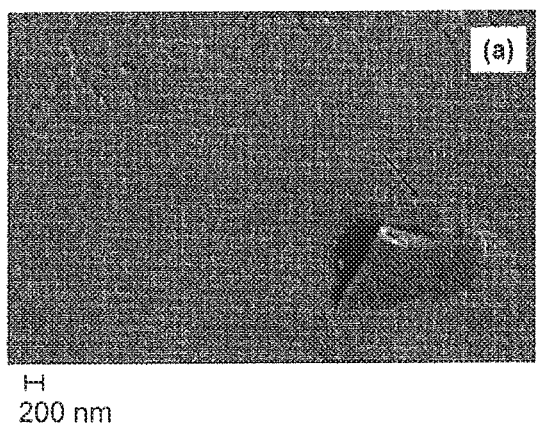 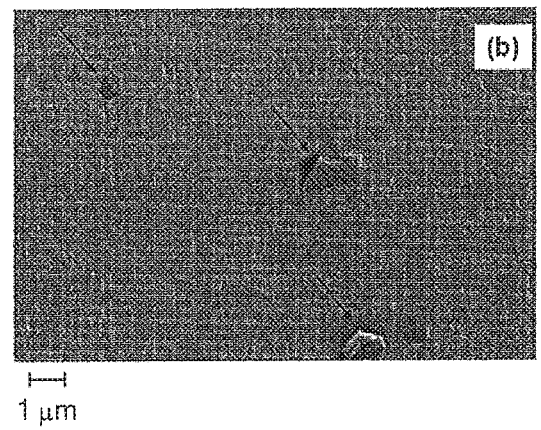
FIG. 15A  FIG. 15B

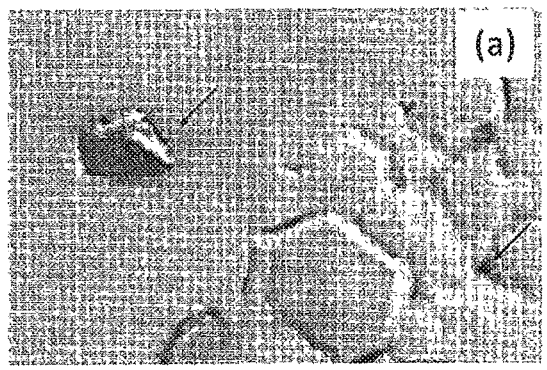
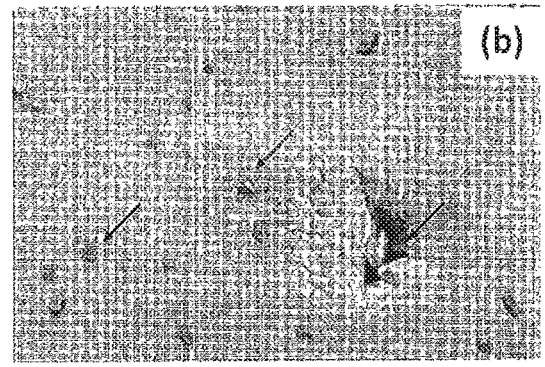
FIG. 16A  FIG. 16B
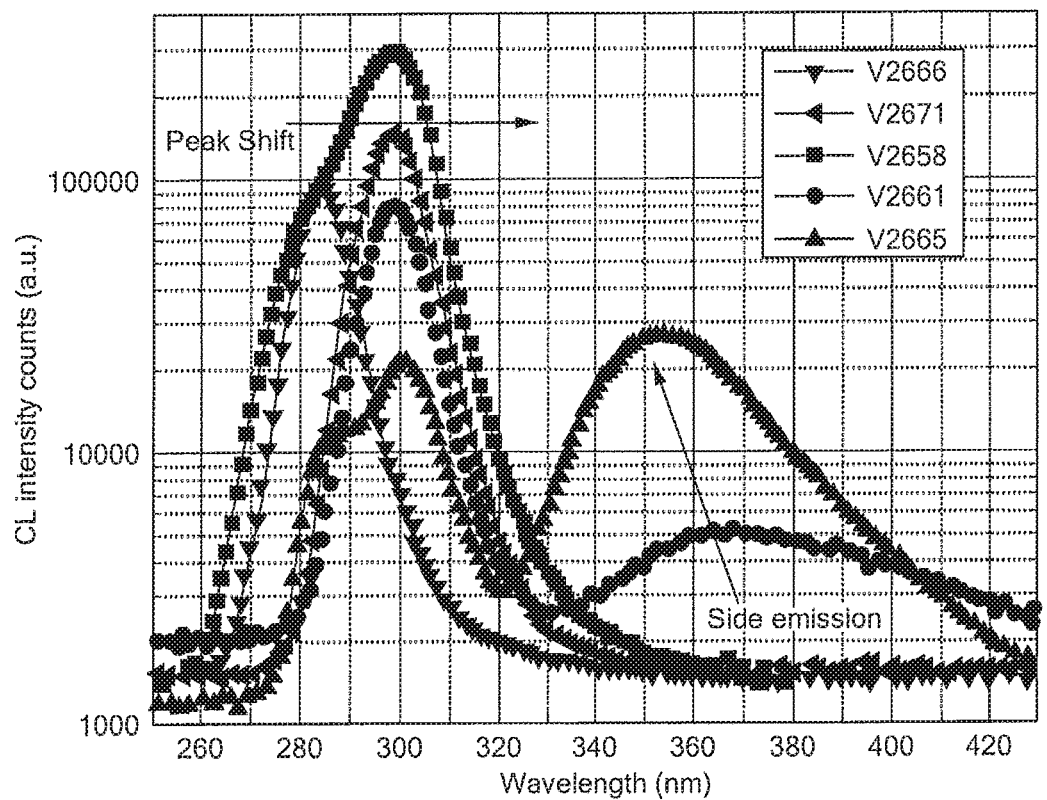
FIG. 17

HIGH EFFICIENCY ULTRAVIOLET LIGHT EMITTING DIODE WITH ELECTRON TUNNELLING

CROSS REFERENCE TO RELATED APPLICATIONS

This application is a continuation of U.S. patent application Ser. No. 14/681,327, filed Apr. 8, 2015, which is a continuation of U.S. patent application Ser. No. 13/646,038, filed Oct. 5, 2012 by Yitao Liao and Theodore D. Moustakas, titled "High Efficiency Ultraviolet Light Emitting Diode with Band Structure Potential Fluctuations", which is a 371(c) national stage entry of PCT/US2011/034724, filed May 2, 2011, which is the international application of U.S. patent provisional application Ser. No. 61/329,947, filed Apr. 30, 2010. U.S. Ser. No. 13/646,038, PCT/US2011/034724, and U.S. 61/329,947 are incorporated herein by reference.

STATEMENT REGARDING FEDERALLY SPONSORED RESEARCH OR DEVELOPMENT

The work leading to this invention was carried out with United States Government support provided under Contract No. W911NF-06-2-0040 awarded by United States Army Research Lab. Thus, the United States Government has certain rights in this invention.

BACKGROUND

The bandgap of III-nitride materials, including (Al, Ga, In)—N and their alloys, extends from the very narrow gap of InN (0.7 eV) to the very wide gap of AlN (6.2 eV), making them highly suitable for optoelectronic applications such as light emitting diodes (LEDs), laser diodes, optical modulators, and detectors over a wide spectral range extending from the near infrared to the deep ultraviolet. Visible light LEDs and lasers can be obtained using InGaN in the active layers, while ultraviolet (UV) LEDs and lasers require the larger bandgap of AlGaN.

Visible spectrum LEDs based on InGaN and AlInGaP systems have reached maturity and are now in mass production. However, the development of UV LEDs is still hampered by a number of difficulties involving basic material properties of AlGaN alloys, especially those with high Al content. Compared to LEDs in the visible spectral range with external quantum efficiency (EQE, the ratio of extracted photons to injected electron-hole pairs) of more than 50%, deep UV LEDs, such as those emitting below 300 nm, have an EQE of only up to 1%.

UV LEDs with emission wavelengths in the range of 230-350 nm are expected to find a wide range of applications, most of which are based on the interaction between UV radiation and biological material [Khan et al., 2008]. Typical applications include surface sterilization, water purification, medical devices and biochemistry, light sources for ultra-high density optical recording, white lighting, fluorescence analysis, sensing, and zero-emission automobiles. Although under extensive research for many years, UV LEDs, especially those emitting below 300 nm, remain extremely inefficient when compared to their blue and green counterparts. For example, Hirayama et al. recently reported 10.5 mW single-chip LED operation at 282 nm and peak EQE of 1.2% [Hirayama et al., 2009].

The growth of III-nitrides onto the c-plane sapphire is well-established. However, III-nitride material grown on c-plane sapphire suffers from the presence of polarization fields due to the polar nature of crystal bonds, which lead to energy band bending and reduction of recombination efficiency in quantum heterostructures due to physical separation of electron-hole wave functions, commonly known as the Quantum Confined Stark Effect (QCSE). Due to lattice mismatch, III-nitride materials grown on sapphire suffer from a high density of defects such as dislocations and inversion domains. A number of methods have been developed to obtain high quality single crystal material for device applications, including optimization of the nucleation process and choice of buffer layers to accommodate lattice mismatch. Alternative substrates, such as (111) Si, lithium aluminum oxide ($LiAlO_3$) and silicon carbide (SiC) of various crystallographic planes also have been used for certain applications. However, native GaN and AlN substrates are still under development and remain prohibitively expensive.

Poor current spreading has been one of the major stumbling blocks to obtaining high efficiency deep UV LEDs, due to difficulties in achieving highly conductive yet sufficiently thick n-type AlGaN bottom cladding layers with high Al content. In 2004, Adivarahan et al. proposed a "micro-pixel" LED. The device consists of a 10×10 micro-pixel LED array, with each pixel being a circular mesa of diameter 26 µm. The total physical dimension of the device is 500 µm×500 µm. Since the lateral distance for electron migration before its recombination with a hole is significantly reduced using such geometry, the differential resistance of the device is lowered to 9.8Ω, as compared to standard square geometry LEDs based on the same epitaxial layers with differential resistances from 40 to 14.4Ω [Adivarahan et al., 2004]. Also in 2004, Kim et al. investigated the trade-off between mesa size and output power of circular-geometry deep UV LEDs, and found that without obtaining more conductive n-type and p-type AlGaN cladding layers, the optimized diameter for circular-disk deep UV LED is limited to about 250 µm [Kim et al., 2004]. Rather than making micro-pixel arrays or simply reducing mesa sizes to improve current spreading in the n-AlGaN cladding layer in traditional mesa-etched LED structure, various research groups have also employed the laser lift-off (LLO) technique for the deep UV. In a vertical structure LED, current spreading is much more efficient since metal contacts can be made vertically on both sides of the LED. In 2006, Zhou et al. at Philips Lumileds reported a vertical injection thin-film deep UV LED based on AlGaN/AlGaN quantum well structures emitting at 280 nm and 325 nm. The authors inserted a pure GaN layer in the epitaxial structure as the lift-off sacrificial layer. The device has dimensions of 700×700 $\mu m_2$, and under 700 mA CW driving current, emits 160 µW at 280 nm and 3.1 mW at 325 nm. In addition to vertical device design, the authors applied a surface roughening process to the surface of the n-layer after lift-off. The roughening technique further increased the optical output power of the 280 nm LED to 0.74 mW (4.6 times improvement) and the 325 nm LED to 8 mW (2.5 times improvement) [Zhou et al., 2006]. In the same year, Kawasaki et al. demonstrated a vertical structure deep UV LED emitting at 322 nm using the LLO technique as well. However, the emission was rather weak and not a single-peak, possibly due to damage of the epitaxial layers during the LLO process [Kawasaki et al., 2006]. The development of LLO vertical thin-film deep UV LED was marked by the demonstration of high power 280 nm LED by the Nitek company in 2009. Nitek reported nearly 5.5 mW operation under 25 $A/cm^2$ CW drive current on a 1×1 mm² vertical structure deep UV LED, with lifetime exceeding 2000 hours [Adivarahan et al., 2009].

Molecular Beam Epitaxy (MBE) has recently been used to develop deep UV LEDs [Nikishin et al., 2008]. However, the output power of these devices is still low compared to those grown by MOCVD. This can partly be attributed to the slow growth rate of epitaxial film grown by MBE, which is thus incapable of producing very thick AlN templates that reduce dislocation density. However, with the advent of thick HVPE-grown AlN templates and free-standing AlN substrates now available from various suppliers, MBE as the production tool solely for the deposition of "LED layers" (i.e. only the n-type, p-type and active layers) may find use as an effective method.

A further problem for UV LEDs is the relative absence of band structure potential fluctuations in AlGaN crystalline material. This is due to the nearly identical size of Al and Ga atoms. This is in contrast to visible light LEDs, where the difference in size of In and Ga atoms the InGaN alloys have a tendency for phase separation leading to band structure potential fluctuations. Thus, injected electrons and holes in the active region of an InGaN-based visible LED are forming excitons, which are localized in these potential fluctuations, which prevents them from diffusing and recombining non-radiatively in defects. Thus, the recombination occurs primarily radiatively leading to LEDs with very high internal quantum efficiency (IQE). Since this mechanism is absent in UV LEDs fabricated by standard methods of growing AlGaN, efforts have been made to introduce band structure potential fluctuations in AlGaN for UV LEDs. U.S. Pat. No. 7,498,182 discloses a UV LED made using an MBE technique that produces faceted growth of AlGaN. The faceted growth mechanism creates localized inhomogeneities. AlGaN alloys described in this invention show clearly compositional inhomogeneities using cathodoluminescence spectroscopy. However, their emission spectra exhibit two peaks, one weaker characterized as band edge emission and the other which is stronger and red-shifted is due to compositional inhomogeneities. This result is clearly described one of the group's papers [C. J. Collins et al., APL, Vol. 86, 031916(2005)].

Thus, there remains a need to improve the crystal growth conditions employed during the deposition of various epitaxial layers in fabricating a UV LED, to develop methods of introducing band structure potential fluctuations, and to develop device designs that eliminate cracking and enhance carrier injection.

SUMMARY OF THE INVENTION

The present invention provides methods for fabricating UV LEDs of high efficiency and high output, and emitting over the range from 200 nm to 365 nm, for use in water purification, surface sterilization, free space non-line-of-sight communications, information storage and retrieval, epoxy curing, medical therapy, and a variety of electronic devices. The methods involve growth of AlGaN semiconductor material under conditions of excess gallium, which covers the surface of the growing film with liquid gallium and changes the growth mode from vapor phase epitaxy to liquid phase epitaxy. This leads to lateral compositional inhomogeneities and thus band structure potential fluctuations due to statistical fluctuations of the thickness of liquid gallium on the surface of the growing film. The invention also provides designs for UV LED construction which avoid cracks in the AlGaN material, optimize the injection of electrons and holes, and maximize light output. The LEDs according to the invention achieve high internal and external quantum efficiency.

One aspect of the invention is a method of fabricating a UV LED having band structure potential fluctuations in an active region of the LED. The method includes the step of growing an AlGaN quantum well layer using an excess of gallium. The excess of gallium is determined as the ratio of gallium flux used to gallium flux needed for stoichiometric growth of AlGaN. In other words, the excess of gallium is equal to Ga flux used/(active N flux−Al flux). Preferably, the gallium excess is in the range from about 1.1 to about 100 on a molar basis. The use of excess gallium conditions during growth of an AlGaN layer is believed to produce a liquid phase of gallium coating the growing surface of the layer, and to induce growth by liquid phase epitaxy, where Al and N atoms are incorporated into the growing film after first dissolving into the surface liquid gallium. The excess gallium growth mode produces microscopic regions of higher gallium and lower AlN mole fraction distributed laterally, i.e., perpendicular to the growth direction, within the quantum well layer, which regions result in band structure potential fluctuations that increase the efficiency of radiative recombination of electrons and holes in the LED. Although the AlN mole fraction is reduced in certain isolated microscopic regions, the macroscopic AlN mole fraction, as measured by X-ray diffraction and optical transmission and reflection measurements, remains the same as determined by the ratio of Al flux to active N flux during growth. As a result of the excess gallium growth mode, the surface of the quantum well layer is smooth and non-faceted. Preferably, the surface is atomically smooth, having a root mean square (RMS) roughness measured by atomic force microscopy (AFM) of less than about 1 nm. The light emission of the LED by electroluminescence is also red shifted in peak wavelength by at least about 10 nm compared with an LED of comparable design having the same AlN mole fraction in the quantum well layer, but produced without using an excess of gallium, i.e., produced using stoichiometric fluxes of Al, Ga, and N.

Another aspect of the invention is a UV LED made by the method described above. The LED includes a first quantum well layer containing an AlGaN material made using an excess of gallium. The quantum well layer has regions of lower AlN mole fraction distributed laterally within the layer, i.e., perpendicular to the growth direction, which form band structure potential fluctuations. The surface of the quantum well layer is smooth and non-faceted, and has an RMS roughness measured by AFM of less than about 1 nm. The peak emission of the LED is red shifted by at least about 10 nm compared with an LED of comparable design having the same AlN mole fraction in the quantum well layer, but produced without using an excess of gallium. The LED can have either a single quantum well or multiple quantum wells, which each quantum well layer disposed between barrier layers. The LED can further have one or more n-type AlGaN layers below the quantum well region and one or more p-type layers above the quantum well region. In certain embodiments, the efficiency of injection of electrons and/or holes is improved by adding additional n-type and/or p-type multilayers, which can vary in dopant concentration, AlN mole fraction, and/or indium concentration. The base of the LED is preferably a c-plane sapphire upon which is grown a high temperature AlN buffer layer; the n-type AlGaN layers are grown onto the buffer layer. A p-type GaN contact layer covers the p-type AlGaN layers, and a metal contact forms the uppermost layer, which reflects emitted light down through the sapphire substrate.

Yet another aspect of the invention is a method of fabricating a semiconductor structure containing a layer of AlGaN material. The method includes the step of growing an AlGaN layer using an excess of gallium, as described above. The AlGaN layer can be grown onto a substrate, a buffer layer, another III-V material layer, or another material, and forms part of a semiconductor structure used in an optoelectronic or electronic component or device, such as an emitter, a laser, a diode, a photocell, a solar cell, a transistor, a memory device, a microprocessor, or the like. Still another aspect of the invention is a semiconductor structure made by this method. The semiconductor structure includes a layer containing AlGaN material made using an excess of gallium and a non-faceted growth mode. The growth surface of the layer is atomically smooth, having an RMS roughness of less than about 1 nm measured by AFM.

The following are also contemplated as embodiments of the invention.

A method of fabricating a UV LED, wherein the first quantum well layer is grown by a method selected from the group consisting of molecular beam epitaxy (MBE), plasma-assisted molecular beam epitaxy (PA-MBE), electron cyclotron resonance molecular beam epitaxy (ECR-MBE), gas-source molecular beam epitaxy (GS-MBE), metal organic chemical vapor deposition (MOCVD, or MOVPE), and atomic layer deposition (ALD).

A method of fabricating a UV LED, wherein the excess of gallium, determined as the ratio of gallium flux used to gallium flux needed for stoichiometric growth of AlGaN and equal to Ga flux used/(active N flux−Al flux), is in the range from about 1.1 to about 100 on a molar basis.

A method of fabricating a UV LED, wherein said first quantum layer comprises regions having different AlN mole fractions distributed perpendicular to the growth direction as a result of the growth process.

A method of fabricating a UV LED, wherein said step of growing comprises the formation of a liquid phase of gallium.

A method of fabricating a UV LED, wherein the liquid phase of gallium coats the growing surface of said quantum well layer.

A method of fabricating a UV LED, wherein the liquid phase gallium varies in thickness laterally across the layer.

A method of fabricating a UV LED, wherein growth of the first quantum layer comprises liquid phase epitaxy.

A method of fabricating a UV LED, wherein the oxygen impurity concentration in the first quantum well layer is less than $1\times10^{18}$ atoms per cm$^3$.

A method of fabricating a UV LED, wherein said step of growing produces a quantum well layer having a smooth surface.

A method of fabricating a UV LED, wherein said smooth surface is essentially devoid of facet structures.

A method of fabricating a UV LED, wherein the smooth surface has a root mean square surface roughness of less than about 1 nm measured by atomic force microscopy.

A method of fabricating a UV LED, wherein the fabricated LED produces an electroluminescence emission whose peak is red shifted by at least about 10 nm compared to an LED of comparable design having the same AlN mole fraction in a quantum well layer made without using an excess of gallium.

A method of fabricating a UV LED, wherein the emission peak is red shifted by at least 20 nm.

A method of fabricating a UV LED that does not include the production of a superlattice structure associated with said quantum well layer.

A method of fabricating a UV LED, further comprising growing barrier layers beneath and above said quantum layer, wherein said barrier layers are grown using an excess of gallium.

A method of fabricating a UV LED, further comprising growing barrier layers beneath and above said quantum layer, wherein said barrier layers are grown without using an excess of gallium.

A method of fabricating a UV LED, wherein the oxygen impurity concentration in the barrier layers is less than $1\times10^{18}$ atoms per cm$^3$.

A method of fabricating a UV LED, further comprising growing a buffer layer of AlN, GaN, AlGaN, or InAlGaN directly onto a surface of a substrate.

A method of fabricating a UV LED, wherein the buffer layer is an AlN buffer layer.

A method of fabricating a UV LED, wherein the substrate comprises a material selected from the group consisting of c-sapphire, a-sapphire, m-sapphire, r-sapphire, c-AlN, a-AlN, m-AlN, r-AlN, (001) Si, (111) Si, c-SiC, a-SiC, m-SiC, r-SiC, c-ZnO, a-ZnO, m-ZnO, and r-ZnO.

A method of fabricating a UV LED, wherein the substrate is c-sapphire.

A method of fabricating a UV LED, wherein the buffer layer has a thickness in the range from about 1 micron to about 5 microns.

A method of fabricating a UV LED, wherein the buffer layer comprises polycrystalline or non-single crystalline structure.

A method of fabricating a UV LED, wherein the substrate is sapphire and the surface of the sapphire substrate on which the buffer layer is grown is nitridated by exposure to ammonia or plasma activated nitrogen prior to growing said buffer layer.

A method of fabricating a UV LED, wherein the buffer layer is grown using an excess of gallium.

A method of fabricating a UV LED, further comprising growing an n-type AlGaN layer onto said buffer layer.

A method of fabricating a UV LED, wherein AlGaN material of said n-type AlGaN layer is described by the formula $Al_aGa_{1-a}N$, wherein $0 \le a \le 1$.

A method of fabricating a UV LED, wherein said n-type AlGaN layer has a thickness in the range from about 100 nm to about 10 microns.

A method of fabricating a UV LED, wherein said n-type AlGaN layer is doped with Si or Ge.

A method of fabricating a UV LED, wherein the fabricated LED has an electroluminescence emission peak in the range from about 200 nm to about 365 nm.

A method of fabricating a UV LED further comprising depositing one or more additional n-type AlGaN layers upon said n-type AlGaN layer to form a stack of n-type AlGaN layers.

A method of fabricating a UV LED, wherein the stack of n-type AlGaN layers comprises a step gradient of n-type dopant.

A method of fabricating a UV LED, wherein the dopant is Si and the Si concentration is in the range from about $1\times10^{16}$ cm$^{-3}$ to about $1\times10^{21}$ cm$^3$.

A method of fabricating a UV LED, wherein the stack of n-type AlGaN layers consists of three AlGaN layers doped with Si to have Si concentrations of about $1\times10^{18}$ cm$^3$, $5\times10^{19}$ cm$^3$, and $1\times10^{20}$ cm$^{-3}$, with corresponding thicknesses of 1 µm, 500 nm and 300 nm, from the bottom to the top of the stack.

A method of fabricating a UV LED, wherein the stack of n-type AlGaN layers comprises a step gradient of AlN mole fraction, and wherein the AlN mole fractions lie in the range from 0.01 to 1.0.

A method of fabricating a UV LED, wherein the stack of n-type AlGaN layers comprises indium in the uppermost layer of the stack.

A method of fabricating a UV LED, wherein said n-type AlGaN layer comprises a gradient of dopant.

A method of fabricating a UV LED, wherein said n-type AlGaN layer comprises a gradient of AlN mole fraction.

A method of fabricating a UV LED, wherein said n-type AlGaN layer comprises a gradient of indium.

A method of fabricating a UV LED, wherein the n-type AlGaN layer is grown using an excess of gallium.

A method of fabricating a UV LED, further comprising growing an n-type multilayer onto the n-type AlGaN layer or the uppermost n-type AlGaN layer of the stack, wherein the multilayer comprises three or more layers of n-type AlGaN, each layer having a thickness in the range from about 0.1 nm to about 100 nm, and the layers varying in dopant concentration or AlN mole fraction.

A method of fabricating a UV LED, wherein the multilayer comprises three n-type AlGaN layers (a top layer, a middle layer, and a bottom layer) and the middle layer has a different AlN mole fraction than the top and bottom layers.

A method of fabricating a UV LED, wherein the multilayer comprises three n-type AlGaN layers (a top layer, a middle layer, and a bottom layer) and the middle layer has a different Si doping concentration than the top and bottom layers.

A method of fabricating a UV LED, wherein the multilayer comprises three n-type AlGaN layers (a top layer, a middle layer, and a bottom layer) and the middle layer has a different In concentration than the top and bottom layers.

A method of fabricating a UV LED, wherein the multilayer comprises more than three n-type AlGaN layers and each layer has a different AlN mole fraction than the layers above or below it.

A method of fabricating a UV LED, wherein the multilayer comprises more than three n-type AlGaN layers and each layer has a different Si doping concentration than the layers above or below it.

A method of fabricating a UV LED, wherein the multilayer comprises more than three n-type AlGaN layers and each layer has a different In concentration than the layers above or below it.

A method of fabricating a UV LED, further comprising growing a first barrier layer onto the n-type AlGaN layer, the uppermost n-type AlGaN layer, or the uppermost n-type AlGaN layer, wherein said first quantum well layer is grown onto the first barrier layer.

A method of fabricating a UV LED, optionally further comprising growing one or more pairs of layers comprising AlGaN on said first quantum well layer, each pair consisting of an additional barrier layer followed by an additional quantum well layer, and further comprising growing an uppermost barrier layer comprising AlGaN onto said first quantum well layer to form a single quantum well structure, or onto an uppermost quantum well layer to form a multiple quantum well structure.

A method of fabricating a UV LED, wherein the uppermost barrier layer is thinner than the first barrier layer and any additional barrier layers.

A method of fabricating a UV LED, wherein the first barrier layer and any additional barrier layers have a thickness in the range from about 3 nm to about 10 nm, the uppermost barrier layer has a thickness from about 1 nm to about 5 nm, and the first barrier layer and any additional barrier layers are about 1.5 to 10 times thicker than the uppermost barrier layer.

A method of fabricating a UV LED, wherein the AlN mole fraction of the quantum well layer or layers is greater than that of the n-type AlGaN layer or layers.

A method of fabricating a UV LED, wherein the first barrier layer, any additional barrier layers, and any additional quantum well layers are grown using an excess of gallium.

A method of fabricating a UV LED, wherein the oxygen impurity concentration in the barrier layers is less than $1\times10^{18}$ atoms per cm$^3$.

A method of fabricating a UV LED, further comprising growing an AlGaN electron blocking layer onto the uppermost barrier layer.

A method of fabricating a UV LED, wherein the electron blocking layer has a thickness in the range from about 3 nm to about 100 nm.

A method of fabricating a UV LED, wherein the electron blocking layer comprises a p-type dopant.

A method of fabricating a UV LED, wherein the electron blocking layer is doped with Mg at a level of about $1\times10^{16}$ cm$^{-3}$ to about $1\times10^{21}$ cm$^{-3}$.

A method of fabricating a UV LED, wherein the electron blocking layer has an AlN mole fraction equal to or greater than that of the uppermost barrier layer.

A method of fabricating a UV LED, wherein the electron blocking layer is grown using an excess of gallium.

A method of fabricating a UV LED, further comprising growing a p-type layer or multilayer of AlGaN onto said electron blocking layer.

A method of fabricating a UV LED, wherein a multilayer is grown and the multilayer comprises three or more layers of p-type AlGaN, each layer having a thickness in the range from about 2 nm to about 100 nm, the layers varying in dopant concentration and/or AlN mole fraction.

A method of fabricating a UV LED, wherein a multilayer is grown and the multilayer comprises alternating layers of p-type AlGaN and p-type GaN.

A method of fabricating a UV LED, wherein the p-type dopant concentration varies between adjacent layers and is in the range from $1\times10^{16}$ cm$^3$ to about $1\times10^{21}$ cm$^3$.

A method of fabricating a UV LED, wherein the AlN mole fraction of the p-type layer or multilayer is less than that of the electron blocking layer.

A method of fabricating a UV LED, wherein the p-type layer or multilayer is grown using an excess of gallium.

A method of fabricating a UV LED, further comprising growing a p-type GaN contact layer onto the p-type layer or multilayer.

A method of fabricating a UV LED, wherein the contact layer is grown using an excess of gallium.

A method of fabricating a UV LED, wherein the contact layer comprises indium at a level in the range from about $1\times10^{16}$ cm$^{-3}$ to about $1\times10^{21}$ cm$^{-3}$.

A method of fabricating a UV LED, wherein the contact layer comprises Mg as dopant at a level in the range from about $1\times10^{16}$ cm$^{-3}$ to about $1\times10^{21}$ cm$^{-3}$.

A method of fabricating a UV LED, wherein the step of growing said first quantum well layer using an excess of gallium produces quantum dot material in the first quantum well layer.

A method of fabricating a UV LED, wherein the production of quantum dot material red-shifts the peak electroluminescence emission of the LED to the range of 330 nm to 365 nm.

A method of fabricating a UV LED, wherein the conditions for growth of said first quantum well layer are non-stoichiometric with respect to Ga, Al, and active N flux.

A method of fabricating a UV LED, wherein the III/V ratio (the ratio of (Ga+Al)/active N)) during growth of said first quantum well layer is greater than 1.

A method of fabricating a UV LED, wherein metal droplets of Ga are not formed on the growing surface of said first quantum well layer.

An ultraviolet LED comprising a first AlGaN quantum well layer made using an excess of gallium during the growth process.

An ultraviolet LED having band structure potential fluctuations resulting from Ga-rich regions within the first quantum well layer.

An ultraviolet LED, wherein the first quantum well layer has a smooth surface.

An ultraviolet LED, wherein the oxygen impurity concentration in the first quantum well layer is less than about $1 \times 10^{18}$ atoms per cm$^3$.

An ultraviolet LED, wherein the smooth surface has a root mean square surface roughness of less than about 1 nm measured by atomic force microscopy.

An ultraviolet LED having a peak electroluminescence emission that is red shifted by at least about 10 nm compared to an LED of comparable design having the same AlN mole fraction in a quantum well layer made without using an excess of gallium.

An ultraviolet LED having a peak electroluminescence emission that is red shifted by at least about 20 nm compared to an LED of comparable design having the same AlN mole fraction in a quantum well layer made without using an excess of gallium.

An ultraviolet LED, wherein the first quantum well layer is essentially devoid of facet structures.

An ultraviolet LED that does not include a superlattice structure associated with said quantum well layer.

An ultraviolet LED, wherein the first quantum well layer is grown by plasma-assisted MBE using an excess of gallium.

An ultraviolet LED, wherein the excess of gallium, determined as the ratio of gallium flux used to gallium flux needed for stoichiometric growth of AlGaN and equal to Ga flux used/(active N flux−Al flux), is in the range from about 1.1 to about 100 on a molar basis.

An ultraviolet LED, further comprising a first barrier layer beneath the first quantum well layer, the barrier layer comprising AlGaN.

An ultraviolet LED, optionally further comprising one or more pairs of layers comprising AlGaN grown onto said first quantum well layer, each pair consisting of an additional barrier layer overlayered by an additional quantum well layer, the LED further comprising an uppermost barrier layer comprising AlGaN grown onto said first quantum well layer to form a single quantum well structure, or grown onto an uppermost quantum well layer to form a multiple quantum well structure.

An ultraviolet LED, wherein said barrier layers are grown by plasma assisted MBE using an excess of gallium.

An ultraviolet LED, wherein the oxygen impurity concentration in the barrier layers is less than about $1 \times 10^{18}$ atoms per cm$^3$.

An ultraviolet LED, wherein the uppermost barrier layer is thinner than the first barrier layer and any additional barrier layers.

An ultraviolet LED further comprising a layer comprising n-type AlGaN.

An ultraviolet LED, wherein AlGaN material of said n-type AlGaN layer is described by the formula $Al_aGa_{1-a}N$, wherein $0 \le a \le 1$.

An ultraviolet LED, wherein said n-type AlGaN layer has a thickness in the range from about 100 nm to about 10 microns.

An ultraviolet LED, wherein said n-type AlGaN layer is doped with Si or Ge.

An ultraviolet LED, wherein the first barrier layer is grown onto the n-type AlGaN layer.

An ultraviolet LED further comprising one or more additional n-type AlGaN layers grown upon said n-type AlGaN layer to form a stack of n-type AlGaN layers.

An ultraviolet LED, wherein the stack of n-type AlGaN layers comprises a step gradient of n-type dopant.

An ultraviolet LED, wherein the dopant is Si and the Si concentration is in the range from about $1 \times 10^{16}$ cm$^{-3}$ to about $1 \times 10^{21}$ cm$^{-3}$.

An ultraviolet LED, wherein the stack of n-type AlGaN layers consists of three AlGaN layers doped with Si to have Si concentration of $1 \times 10^{18}$ cm$^{-3}$, $5 \times 10^{19}$ cm$^{-3}$, and $1 \times 10^{20}$ cm$^{-3}$, with corresponding thicknesses of 1 μm, 500 nm and 300 nm, from the bottom to the top of the stack.

An ultraviolet LED, wherein the stack of n-type AlGaN layers comprises a step gradient of AlN mole fraction, and wherein the AlN mole fractions lie in the range from 0.01 to 1.0.

An ultraviolet LED, wherein the stack of n-type AlGaN layers comprises indium in the uppermost layer of the stack.

An ultraviolet LED, wherein the first barrier layer is grown onto the uppermost layer of the n-type AlGaN stack.

An ultraviolet LED, wherein said n-type AlGaN layer comprises a gradient of dopant.

An ultraviolet LED, wherein said n-type AlGaN layer comprises a gradient of AlN mole fraction.

An ultraviolet LED, wherein said n-type AlGaN layer comprises a gradient of indium.

An ultraviolet LED, wherein the n-type AlGaN layer is grown using an excess of gallium.

An ultraviolet LED, further comprising an n-type multilayer grown onto the n-type AlGaN layer or the uppermost n-type AlGaN layer of the stack, wherein the multilayer comprises three or more layers of n-type AlGaN, each layer having a thickness in the range from about 0.1 nm to about 100 nm, and the layers varying in dopant concentration or AlN mole fraction, and wherein the first barrier layer is grown upon the uppermost layer of the multilayer.

An ultraviolet LED, wherein the multilayer comprises three n-type AlGaN layers (a top layer, a middle layer, and a bottom layer) and the middle layer has a different AlN mole fraction than the top and bottom layers.

An ultraviolet LED, wherein the multilayer comprises three n-type AlGaN layers (a top layer, a middle layer, and a bottom layer) and the middle layer has a different Si doping concentration than the top and bottom layers.

An ultraviolet LED, wherein the multilayer comprises three n-type AlGaN layers (a top layer, a middle layer, and a bottom layer) and the middle layer has a different In concentration than the top and bottom layers.

An ultraviolet LED, wherein the multilayer comprises more than three n-type AlGaN layers and each layer has a different AlN mole fraction than the layers above or below it.

An ultraviolet LED, wherein the multilayer comprises more than three n-type AlGaN layers and each layer has a different Si doping concentration than the layers above or below it.

An ultraviolet LED, wherein the multilayer comprises more than three n-type AlGaN layers and each layer has a different In concentration than the layers above or below it.

An ultraviolet LED, further comprising a buffer layer and a substrate, wherein the buffer layer is grown onto a surface of the substrate and the n-type AlGaN layer is grown onto the buffer layer.

An ultraviolet LED, wherein the substrate comprises a material selected from the group consisting of c-sapphire, a-sapphire, m-sapphire, r-sapphire, c-AlN, a-AlN, m-AlN, r-AlN, (001) Si, (111) Si, c-SiC, a-SiC, m-SiC, r-SiC, c-ZnO, a-ZnO, m-ZnO, and r-ZnO.

An ultraviolet LED, wherein the substrate is c-sapphire.

An ultraviolet LED, wherein the surface of the sapphire substrate on which the buffer layer is grown is nitridated.

An ultraviolet LED, wherein the buffer layer comprises polycrystalline or non-single crystalline structure.

An ultraviolet LED, wherein the buffer layer has a thickness in the range from about 1 micron to about 5 microns.

An ultraviolet LED, wherein the buffer layer comprises AlN, GaN, AlGaN, InAlGaN, or any mixture thereof.

An ultraviolet LED, wherein the buffer layer is an AlN buffer layer.

An ultraviolet LED, wherein the n-type AlGaN layer is grown upon the buffer layer.

An ultraviolet LED, further comprising an AlGaN electron blocking layer, wherein the electron blocking layer is grown upon the uppermost barrier layer.

An ultraviolet LED, wherein the electron blocking layer has a thickness in the range from about 3 nm to about 100 nm.

An ultraviolet LED, wherein the electron blocking layer comprises a p-type dopant.

An ultraviolet LED, wherein the electron blocking layer is doped with Mg at a level of about $1\times10^{16}$ cm$^{-3}$ to about $1\times10^{21}$ cm$^{-3}$.

An ultraviolet LED, wherein the electron blocking layer has an AlN mole fraction equal to or greater than that of the uppermost barrier layer.

An ultraviolet LED, wherein the electron blocking layer is grown using an excess of gallium.

An ultraviolet LED, further comprising growing a p-type layer or multilayer of AlGaN onto said electron blocking layer.

An ultraviolet LED, wherein a p-type multilayer is grown and the multilayer comprises three or more layers of p-type AlGaN or p-type GaN, each layer having a thickness in the range from about 2 nm to about 100 nm, the layers varying in dopant concentration or AlN mole fraction.

An ultraviolet LED, wherein a p-type multilayer is grown and the multilayer comprises alternating layers of p-type AlGaN and p-type GaN.

An ultraviolet LED, wherein the p-type dopant concentration varies between adjacent layers and is in the range from $1\times10^{16}$ cm$^3$ to about $1\times10^{21}$ cm$^3$.

An ultraviolet LED, wherein the AlN mole fraction of the p-type layer or multilayer is less than that of the electron blocking layer.

An ultraviolet LED, wherein the p-type layer or multilayer is grown using an excess of gallium.

An ultraviolet LED, further comprising a p-type GaN contact layer grown onto the p-type layer or multilayer.

An ultraviolet LED, wherein the contact layer is grown using an excess of gallium.

An ultraviolet LED, wherein the contact layer comprises indium at a level in the range from about $1\times10^{16}$ cm$^{-3}$ to about $1\times10^{21}$ cm$^{-3}$.

An ultraviolet LED, wherein the contact layer comprises Mg as dopant at a level in the range from about $1\times10^{16}$ cm$^{-3}$ to about $1\times10^{21}$ cm$^{-3}$.

An ultraviolet LED, further comprising a contact structure deposited onto the uppermost n-type layer, stack, or multilayer, said contact structure providing Ohmic contact with said uppermost n-type layer, stack, or multilayer, wherein the contact structure comprises a material selected from the group consisting of Ti, V, Al, Pt, Ni, Mo, Pd, ITO, Zn, ZnO, Au, their alloys, their alloys with semiconductors, and their alloys with nitrogen.

An ultraviolet LED, wherein the thickness of the contact structure is in the range from about 10 nm to about 300 nm.

An ultraviolet LED, wherein the resistance of said Ohmic contact is in the range from about $1\times10^{-2}$ to about $1\times10^{-6}$ ohm·cm$^2$.

An ultraviolet LED, further comprising a contact structure deposited onto the uppermost p-type layer or multilayer, said contact structure providing Ohmic contact with said uppermost p-type layer or multilayer, wherein the contact structure comprises a material selected from the group consisting of Ti, V, Al, Pt, Ni, Mo, Pd, ITO, Zn, ZnO, Au, their alloys, their alloys with semiconductors, and their alloys with nitrogen.

An ultraviolet LED, wherein the thickness of the contact structure is in the range from about 10 nm to about 300 nm.

An ultraviolet LED, wherein the resistance of said Ohmic contact is in the range from about $1\times10^{-2}$ to about $1\times10^{-6}$ ohm·cm$^2$.

An ultraviolet LED, wherein the mole fraction of AlN in the n-type AlGaN layer, stack, or multilayer is equal to or less than the AlN mole fraction of the quantum well layer or layers.

An ultraviolet LED having a peak electroluminescence emission of less than 320 nm.

An ultraviolet LED having a peak electroluminescence emission of less than 300 nm.

An ultraviolet LED, wherein the AlN mole fraction of the n-type AlGaN layer, stack, or multilayer is greater than 0.5.

An ultraviolet LED, wherein the first quantum well layer is devoid of surface pits.

An ultraviolet LED having a peak electroluminescence emission in the range from about 200 nm to about 365 nm.

An ultraviolet LED having an internal quantum efficiency of at least 30%.

An ultraviolet LED having an internal quantum efficiency of at least 70%.

An ultraviolet LED, wherein said first AlGaN quantum well layer comprises quantum dot material.

An ultraviolet LED, wherein the peak electroluminescence emission of the LED is in the range of 330 nm to 365 nm.

An ultraviolet LED, wherein the peak electroluminescence emission of the LED is in the range of 200 nm to 365 nm.

BRIEF DESCRIPTION OF THE DRAWINGS

FIG. 4 shows a scanning electron micrograph (SEM) of an n-type AlGaN film showing cracks at grain boundaries.

FIG. 5A shows an SEM of a cracked n-type $Al_{0.55}Ga_{0.45}N$ film deposited over a thin AlN buffer layer on a sapphire substrate. FIG. 5B shows the epitaxial structure of the film in FIG. 5A.

FIG. 6A shows an SEM of a cracked n-type $Al_{0.55}Ga_{0.45}N$ film deposited over three sets of AlGaN/AlN strain management superlattices and a thin AlN buffer layer on a sapphire substrate. The strain management superlattice has not eliminated cracking. FIG. 6B shows the epitaxial structure of the film in FIG. 6A.

FIG. 7A shows an SEM of an n-type $Al_{0.55}Ga_{0.45}N$ 1.5 micron thick film deposited over a 3 micron thick AlN buffer layer on a sapphire substrate. The thick AlN buffer layer has eliminated the cracking problem. FIG. 7B shows the epitaxial structure of the film in FIG. 7A.

FIG. 8A shows an SEM of the surface of an n-type $Al_{0.55}Ga_{0.45}N$ multilayer and a thick AlN buffer layer on a sapphire substrate. FIG. 8B shows the epitaxial structure of the film in FIG. 8A.

FIG. 9A shows an SEM of the surface of a p-type $Al_{0.4}Ga_{0.6}N$ multilayer. FIG. 9B shows an SEM of the surface of a p-type $Al_{0.3}Ga_{0.7}N$ multilayer.

FIG. 12 shows the epitaxial structure of AlGaN/AlGaN MQW samples used to investigate IQE.

FIG. 13A shows an SEM showing surface morphology of sample V2666 at 50,000-fold magnification. FIG. 13B shows the same sample at 20,000-fold magnification. The arrows indicate surface pits due to incomplete film coalescence. The sample was grown under near stoichiometric conditions.

FIG. 14A shows an SEM showing smooth surface morphology of sample V2658 at 50,000-fold magnification. FIG. 14B shows the same sample at 20,000-fold magnification. The arrows indicate a nitridated droplet.

FIG. 15A shows an SEM showing surface morphology of sample V2661 at 50,000-fold magnification. FIG. 15B shows the same sample at 20,000-fold magnification. The arrows indicate a nitridated droplet.

FIG. 16A shows an SEM showing surface morphology of sample V2665 at 50,000-fold magnification. FIG. 16B shows the same sample at 20,000-fold magnification. The arrows indicate a nitridated droplet.

FIG. 17 shows cathode luminescence spectra CL of $Al_{0.5}Ga_{0.5}N$/$Al_{0.6}Ga_{0.4}N$ MQW samples.

DETAILED DESCRIPTION OF THE INVENTION

Figure 1:
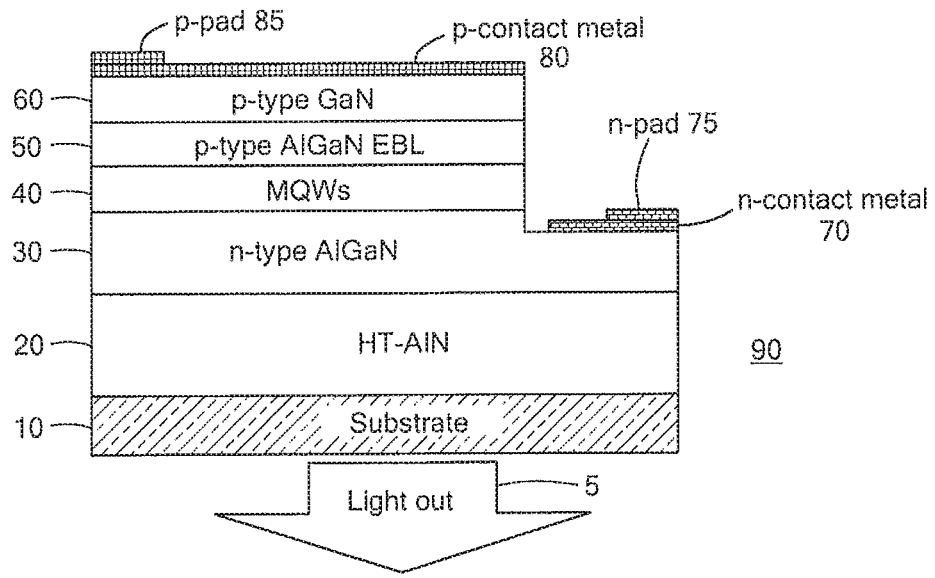
FIG. 1 shows an embodiment of a UV LED according to the invention.

The present inventors have developed methods for fabricating LEDs emitting in the ultraviolet range that avoid many of the difficulties associated with such devices up to now. In particular through the use of excess Ga growth conditions, high quality crystalline AlGaN can be grown without the cracks and dislocations typical for this material, and when this method is applied for the growth of a quantum well layer and optionally for other layers, the resulting LED contains band structure potential fluctuations, resulting in much greater internal quantum efficiency and light output.

Methods according to the invention can be used to make devices for use in water purification, surface sterilization, communications, information storage and retrieval, epoxy curing, medical therapy, and a variety of electronic devices. They are especially useful for making LEDs, including UV LEDs. The also can be used to produce optoelectronic emitters made from intrinsic semiconductor multiple quantum well structure combined with an external excitation device, including but not limited to photon excitation and electron beam excitation. In the area of sterilization, purification, and biological research, the methods and devices of the invention can be used in dermatology, biosensors, blood and serum analysis, DNA sequencing and microarrays (including nucleic acid and protein microarray systems), microscopy and imaging, corneal treatment, toothbrush sterilization, photo-deodorization of air, maskless lithography, detecting and killing bacteria, and general decontamination. In the areas of military, homeland security, and agriculture, the methods and devices of the invention can be used for currency validation, anthrax detection, passport and ID control, forensic investigations, machine vision, insect vision manipulation, and insect attraction. In the areas of industry and hobby or sporting uses, the methods and devices of the invention can be used for inks, adhesives, coatings, encapsulants, scorpion detection, fishing lures, aquarium lighting, mineral and coral fluorescence, die tracing, leakage detection, and spectrofluorimetry.

While not intending to limit the invention to any particular mechanism, it is believed that the use of excess Ga growth condition gives rise to growth by liquid phase epitaxy, whereby Ga atoms form a liquid phase at the growth surface, requiring that arriving Al and N atoms first dissolve in the liquid Ga phase prior to incorporation in the growing crystal. Local heterogeneities in the thickness of the liquid Ga phase then produces isolated regions of lower AlN mole fraction, distributed laterally across the growth surface. The excess Ga growth condition produces an atomically smooth surface, which is also believed to result from the LPE growth mechanism.

Previous work by others (U.S. Pat. No. 7,498,182) has allegedly produced AlGaN LEDs having inhomogeneities resulting from nitrogen limited growth. The inhomogeneities created by nitrogen limited growth give rise to local variation of the AlN mole fraction, band structure potential fluctuations, and a red-shifted emission. However, nitrogen-limited growth results in a faceted growth mode, giving rise to faceted, pitted surface structure and producing an LED with significantly lower internal quantum efficiency than with the present method.

The present invention also provides several design features which, together with the use of excess gallium during layer growth, optimize the performance of a UV LED with band structure potential fluctuations. FIG. 1 illustrates the basic design of a UV LED 90 according to the invention, which is described below.

Layers of semiconductor material comprising AlGaN are epitaxially grown upon substrate 10. The substrate material should be capable of supporting the epitaxial growth of III-nitrides including AlGaN, and should have high transmission for UV light so that light can be extracted from the bottom of the device. Suitable substrates include c-sapphire, a-sapphire, m-sapphire, r-sapphire, c-AlN, a-AlN, m-AlN, r-AlN, (001) Si, (111) Si, c-SiC, a-SiC, m-SiC, r-SiC, c-ZnO, a-ZnO, m-ZnO, and r-ZnO. The surfaces of the substrate can be smooth, or either surface can be textured to improve light extraction. C-plane sapphire substrates are preferred, as are sapphire substrates that have been nitridated by exposure to ammonia or plasma-activated nitrogen prior to growth of a buffer layer.

Buffer layer 20 is grown directly onto the substrate and contains polycrystalline or non-single crystalline structure (i.e., substantially crystalline material containing some defects or boundaries). The purpose of the buffer layer is to establish a quasi-nitride substrate on which the AlGaN film can be grown under compressive stress with reduced density of threading dislocations and high crystalline quality. The buffer layer can be any III-nitride material, such as AlN, GaN, AlGaN, InAlGaN, or mixtures thereof. AlN is the preferred material for the buffer layer. The buffer layer can have a thickness ranging from about 10 nm to 100 microns. Preferably, the buffer layer is somewhat thick compared to visible light LEDs so as to prevent cracking of AlGaN deposited on the buffer layer. Preferably the thickness of the buffer layer is in the range from about 1 micron to about 5 microns. Optionally, a plurality of buffer layers can be used, e.g., 2-3 superimposed buffer layers of the same or different materials, instead of a single buffer layer. If AlGaN is used for the buffer layer, it can be grown under excess Ga conditions. High growth temperature for the buffer layer is desired in order to produce good quality AlN epitaxial layers. The temperature range for AlN growth should be in the range of 700 C to 1200 C across different epitaxial growth tools.

Second growth layer 30 is an n-doped AlGaN layer grown onto the buffer layer. N-contact metal 70 is deposited onto an exposed surface of the n-type AlGaN layer, and n-pad 75 is deposited onto the contact metal for connection to a power source. The second growth layer can be an $Al_aGa_{1-a}N$ film doped n-type with Si, Ge or other potential n-type dopants. It has a thickness from about 100 nm to about 10 microns and is grown directly on the buffer layer(s). The doping level of Si can range from $1\times10^{16}$ cm$^{-3}$ to $1\times10^{21}$ cm$^{-3}$. Depending on the intended emission wavelength, the AlN mole fraction "a" in the formula $Al_aGa_{1-a}N$ varies from 0% for devices emitting at 360 nm to 100% for devices designed to emit at 200 nm. The n-type AlGaN film can also be configured as a multilayer containing a variety of possible AlGaN layer stacks and stack combinations, including, but not limited to n-AlGaN layers doped at different silicon impurity levels and their combinations. The use of a multilayer of n-AlGaN can improve lateral conductivity. In a typical embodiment, a three-layer stack structure is used consisting of n-type $Al_aGa_{1-a}N$ layer doped with silicon to have free electron concentrations of $1\times10^{17}$ cm$^3$, $5\times10^{18}$ cm$^{-3}$, and $1\times10^{19}$ cm$^{-3}$, with corresponding thicknesses of 1 μm, 500 nm, and 300 nm, respectively. Alternatively, layer 30 can be doped with gradiently increasing or decreasing Si dopant concentration from $1\times10^{16}$ cm$^{-3}$ to $1\times10^{21}$ cm$^{-3}$; or it can have a fixed Si dopant concentration but an AlN mole fraction varying from one layer to the next, within the range from 0.0001 to 0.9999. The n-contact metal layers preferably are formed on the n-AlGaN layer with the highest Si doping. Indium also can be incorporated in the n-AlGaN layer to improve structural quality of the layers and to provide strain relief. The total thickness of the n-AlGaN layer or layers can be in the range from about 500 nm to about 4 microns. All n-type AlGaN layers described above preferably are grown under excess Ga conditions.

Because the UV LEDs of the present invention have a red-shifted emission, the AlN mole fraction in the n-type AlGaN layer(s) can be reduced, and the Si doping level increased, compared to conventional UV LEDs. This reduces the incidence of cracks and avoids the need for a superlattice structure to manage strain, thereby simplifying the manufacturing process and improving the quality of the III-V crystalline material. In some embodiments, an LED according to the present invention does not contain any superlattice structure.

The active layers 40 can be either a single quantum well or multiple quantum wells (MQWs) which are grown onto the uppermost of the n-type AlGaN layers. Each quantum well consists of a quantum well layer 42 between two barrier layers 44 (see FIG. 22 for example of quantum well layers and barrier layers). The quantum well and barrier layers contain $Al_xGa_{1-x}N/Al_yGa_{1-y}N$, wherein $0<x<y<1$, and x represents the AlN mole fraction of a quantum well layer and y represents the AlN mole fraction of a barrier layer. The MQWs start with a first barrier layer $Al_{y1}Ga_{1-y1}N$ ($0<y1<1$) on top of the last n-AlGaN multi-layer, where y1 can have the same, lower, or higher AlN mole fraction than the last n-type AlGaN layer, and the thickness of the first barrier layer is from about 0.1 nm to about 100 nm. On top of first barrier layer, a quantum well layer of $Al_{x1}Ga_{1-x1}N$ is grown, with lower AlN mole fraction than the barrier layer; the thickness of the quantum well layer is from about 0.1 nm to about 100 nm. On top of the well layer, another $Al_{y2}Ga_{1-y2}N$ layer is grown as the second barrier layer. The second barrier layer has a higher AlN mole fraction than that of the well layer, so as to provide quantum confinement ($0<x1<y2<1$). Y2 can be equal to or less than y1. The thickness of the second barrier is from about 0.1 nm to about 100 nm. In general the last barrier layer is thicker than the first barrier layer. The quantum well and barrier layers can be grown using excess Ga.

On the top of the last barrier of the active region, a p-typed doped (e.g., Mg-doped) AlGaN film is grown, which is electron blocking layer (EBL) 50. This layer has an AlN mole fraction higher than that used in the barrier layers. The EBL is grown with a thickness in the range from about 1 nm to about 30 nm. The role of this layer is to prevent electrons injected from the n-side into the active region from reaching the p-side of the LED structure. The Mg-doped AlGaN EBL can also be replaced with an AlN layer (Mg doped or undoped) grown with excess Ga. An AlGaN EBL and an AlN EBL also can be combined. The EBL is preferably grown with excess Ga.

Following the electron blocking layer, one or more p-type doped (e.g. Mg-doped) AlGaN layers 60 are deposited. The AlN mole fraction can range from 0 to 100%, and the thickness of this layer or multilayer can range from about 2 nm to about 100 nm (single layer) or to about 500 nm (multilayer). A multilayer used in this region can improve lateral conductivity. The Mg doping level can vary from $1\times10^{16}$ cm$^{-3}$ to $1\times10^{21}$ cm$^{-3}$. In one embodiment the AlN mole fraction of layer 60 is half that of the EBL. In another embodiment, layer 60 is split into two layers, a first p-type AlGaN layer and a second layer of p-type GaN (contact layer). The AlN mole fraction of the p-type AlGaN layer of layer 60 is half of the AlN mole fraction of the EBL. In a variant of this embodiment, a multilayer is used, containing alternating p-AlGaN and p-GaN layers. A Mg-doped pure GaN layer, grown on top of the last layer of p-type AlGaN multilayers, is preferably used as the final, uppermost layer of the UV-LED structure. The p-GaN layer serves as the contact layer where contact metal stacks (80,85) are deposited to form p-Ohmic contacts to the LED structure. The p-GaN layer can be grown with indium at a concentration in the range from $1\times1016$ cm$^{-3}$ to $1\times10^{21}$ cm$^3$. The Mg doping level can vary from $1\times10^{16}$ cm$^{-3}$ to $1\times10^{21}$ cm$^{-3}$. Layer 60 or its component layers are preferably grown with excess Ga.

The LED design and growth methodology of the present invention can improve LED efficiency in several ways. As used herein, "internal quantum efficiency" or IQE refers to the ratio of the number of photons emitted by radiative recombination from the active region of the LED (usually quantum heterostructures) to the number of electron-hole pairs injected into the LED. IQE can be improved, for example, by growing the AlGaN layers of the device, or at least a quantum well layer of the device, using excess Ga conditions to produce band structure potential fluctuations. As used herein "extraction efficiency" or EE refers to the fraction of photons produced that escape from the LED device (including epitaxial layers, metal contacts, and packaging encapsulates) to air. To increase extraction efficiency, light emission from the active region must find a path to air through refraction, instead of propagating inside the LED and transforming into heat. Carrier injection efficiency (IE) refers to the ratio of electron-hole pairs injected into the active region of the LED to the electrons and holes supplied to the device. The LED designs of the present invention increase IE, for example, through the use of polarization doping layers or multilayers in the n-type AlGaN and/or p-type AlGaN layers. External quantum efficiency (EQE) is the ratio of extracted light in the form of photons to injected electron-hole pairs. It is the product of the internal quantum efficiency, carrier injection efficiency and extraction efficiency.

Growth of AlGaN Under Stoichiometric Conditions

In "stoichiometric growth" of $Al_xGa_{1-x}N$ by plasma-assisted MBE, the flux of active nitrogen atoms (atomic, ionic, and metastable radicals of nitrogen, such as $N_2^*$) equals the sum of the fluxes of aluminum and gallium atoms. That is, N=Al+Ga. The aluminum and gallium atoms participating in the growth process are measured by their beam equivalent pressure (BEP), also referred to as their "flux". The aluminum and gallium fluxes are controlled by the temperatures of the aluminum and gallium source cells in the MBE system facing the surface of the substrate. The flux of active nitrogen is controlled by the plasma power (in watts) and the nitrogen source gas flow (in standard cubic centimeters, SCCM). The amount of active nitrogen atoms generated by given plasma power and nitrogen source gas flow can be measured indirectly by growing a pure AlN film under stoichiometric conditions, where each active nitrogen atom bonds with one aluminum atom. Therefore, the equivalent active nitrogen "flux" equals the aluminum flux (the BEP of aluminum), or N=Al.

One method to identify stoichiometric conditions during film growth is by reflection high energy electron diffraction (RHEED). When growing under stoichiometric conditions, the RHEED pattern is bright and streaky, and when the Al supply to the growth is interrupted or stopped, the RHEED will show a 2×2 reconstruction pattern immediately.

As an example, if the Al flux (BEP) is $7\times10^{-7}$ Torr for stoichiometric growth of AlN, then the active nitrogen flux is $7\times10^{-7}$ Torr. For a given Al flux, one can adjust the plasma power or the nitrogen source gas flow to obtain the stoichiometric condition. Alternatively, for a certain plasma power or nitrogen source gas flow that produces a certain amount of active nitrogen, one can adjust the Al flux (the Al source cell temperature) to obtain the stoichiometric condition.

Control of AlN Mole Fraction of AlGaN

To grow AlGaN of a certain AlN mole fraction, one can take the pre-determined active nitrogen flux for stoichiometric AlN growth, and multiply that by the desired AlN mole fraction to calculate the Al flux needed. For example, to grow $Al_{0.6}Ga_{0.4}N$ with an active nitrogen flux of $7\times10^{-7}$ Torr, the Al flux needed will be $4.2\times10^{-7}$ Torr. The actual AlN mole fraction in the AlGaN product can be verified by a variety of post-growth measurements, including X-ray diffraction, optical transmission/reflection, and Rutherford back scattering.

The remaining Ga flux can then be determined by the following relationship:

$$\text{Ga flux}=\text{Active nitrogen flux}-\text{Al flux}=7\times10^{-7}-4.2\times10^{-7}=2.8\times10^{-7}$$

Note that this Ga flux provides the exact amount of gallium needed to grow AlGaN under stoichiometric conditions for the given active nitrogen flux and desired AlN mole fraction. AlGaN grown under stoichiometric conditions produces a film with facetted and rough surface morphology, having pits on the surface. However, this leads to low internal quantum efficiency.

Under both stoichiometric and excess-Ga growth of AlGaN, the AlN mole fraction is determined exclusively by the Al flux, since nitrogen atoms first bond preferentially with Al atoms, and then bond with Ga atoms.

Growth of AlGaN Under Excess Gallium Conditions

Given the preferential reactivity of N for Al over Ga, an excess of Al is not possible as long as the total amount of Al+Ga is less than or equal to the amount of N. However, an excess of Ga occurs whenever the flux of Ga used exceeds the quantity of Ga needed for stoichiometric growth, which is the quantity (active N−Al).

In the present invention, band structure potential fluctuations are introduced into AlGaN through growth under excess Ga conditions. Here "excess Ga flux" means the amount of Ga used in the growth that is more than the amount needed to establish stoichiometry. For example, to grow $Al_{0.6}Ga_{0.4}N$ under excess Ga conditions, one can use the same active nitrogen flux and Al flux and employ more Ga flux than needed for stoichiometric condigions. Using the flux values mentioned above, where active N flux=$7\times10^{-7}$ Torr and Al flux=$4.2\times10^{-7}$ Torr, then excess Ga would be obtained by using any amount over $2.8\times10^{-7}$ Torr, such as $2.8\times10^{-6}$ Torr, for example.

As used herein, the term "excess gallium" or "excess gallium ratio" may also be expressed as the ratio of Ga flux used to the Ga flux needed to obtain stoichiometric growth for the desired AlN mole fraction:

$$\text{Excess Ga}=\text{Total Ga flux}/\text{Ga flux needed for stoichiometry}$$

In the example above, the excess Ga ratio=$2.8\times10^{-6}/2.8\times10^{-7}=10$.

The excess Ga will not incorporate into the growing film but stabilizes at the growing surface and forms a metal layer of Ga with thickness variations distributed laterally across the growth surface. This results in growth by liquid phase epitaxy (LPE), whereby the incoming active nitrogen and Al atoms dissolve into the liquid phase Ga metal at the surface and saturate the Ga to deposit AlGaN film. This process produces AlGaN films with atomically smooth surface morphology, strong band structure potential fluctuations, a strongly-red shifted emission spectrum in LEDs made using the material in their active region, and LEDs having very high internal quantum efficiency.

Figure 11A:
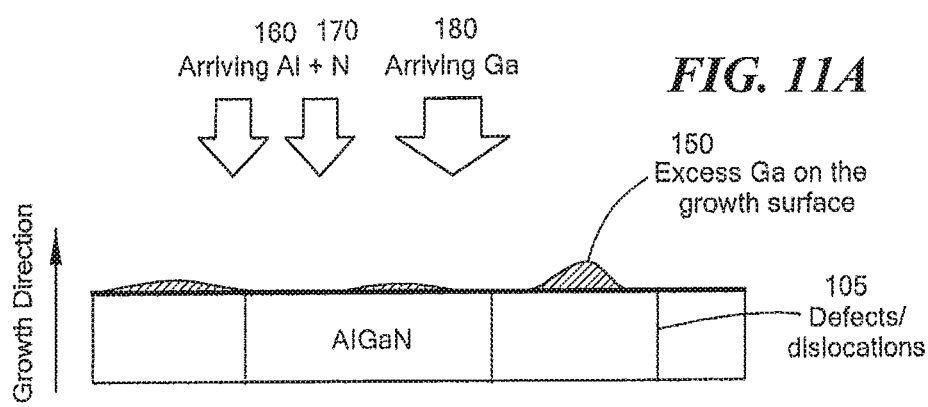
FIG. 11A shows a diagram depicting the growth of an AlGaN layer under conditions of excess gallium flux.
Figure 11B:
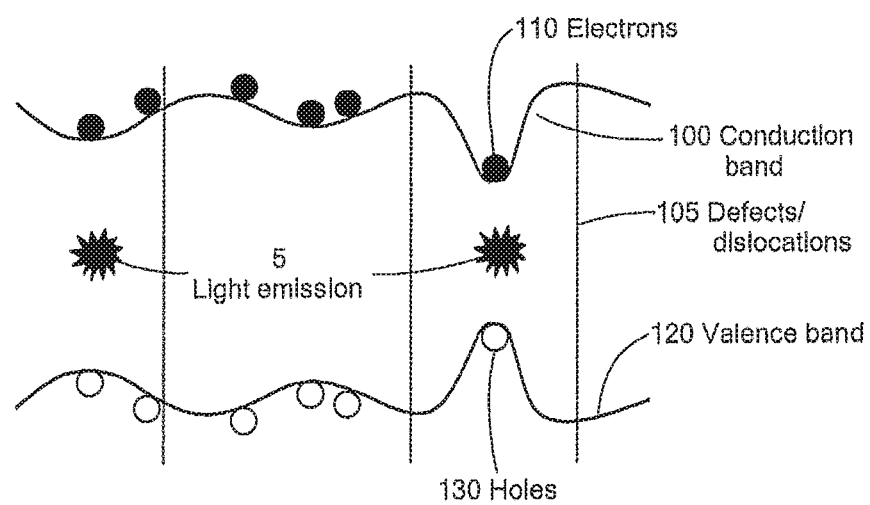
FIG. 11B shows a diagram of the potential energy fluctuations in the conduction and valence bands as a function of the deposition of excess gallium in FIG. 11A.

The growth of AlGaN films under excess Ga conditions is depicted in FIG. 11. The top portion of the figure shows a growing AlGaN layer in cross section, while the bottom portion shows the corresponding potential energy levels of the conductance band 100 and valence band 120. The layer contains crystal defects and dislocations 105, which correspond to large energy gaps. The presence of excess Ga 150 on the surface affects the incorporation of arrive Al atoms 160, N atoms 170, and Ga atoms 180, which no longer incorporate directly into the crystal structure, but first dissolve in the liquid Ga phase at the surface. Localized regions of excess Ga cause localized reduction in AlN mole fraction, corresponding to band structure potential fluctuations, which form favored locations for the recombination of electrons 120 and holes 130, resulting in light emission 5.

Due to the effect of excess liquid Ga at certain locations on the growing surface, small isolated areas of reduced AlN mole fraction are produced within the growing AlGaN layer. Although the AlN mole fraction is reduced in certain isolated microscopic regions, the macroscopic AlN mole fraction, as measured by X-ray diffraction and optical transmission and reflection measurements, remains the same as determined by the ratio of Al flux to active N flux during growth. The microscopic regions of reduced AlN mole fraction are in the nanometer range, up to 100 nm, 200 nm, 500 nm, or up to about 1 micron in size (i.e., in diameter).

The growth rates of AlGaN films were evaluated over a wide range of AlN mole fractions and excess Ga ratios. Excess Ga ratios in the range from about 1.01 to about 100 can be used to produce the characteristics described herein. Alternatively, excess Ga ratios in the range from about 1.1 to 100, 1.1 to 50, 1.1 to 20, 1.1 to 10, 1.1 to 5, 2 to 5, 2 to 10, 2 to 20, 5 to 10, 5 to 20, 5 to 50, 10 to 20 and 10 to 50 can be used.

The effective excess Ga ratio also depends on the substrate temperature. Very high substrate temperatures can effectively decrease the excess Ga metal covering the growing surface due to re-evaporation of the Ga atoms. Preferably, the substrate temperature should be in the range from about 500 to 1000 degrees C. The substrate temperature can be measured by a temperature measurement device placed at the back side of the sapphire substrate or by a pyrometer facing the surface of the growing semiconductor film.

Growth Techniques

Any method capable of growing III-nitride semiconductor materials, including AlN, AlGaN, and GaN, can be used to carry out the methods of the invention. Examples of such methods include molecular beam epitaxy (MBE), plasma-assisted molecular beam epitaxy (PA-MBE), electron cyclotron resonance molecular beam epitaxy (ECR-MBE), gas-source molecular beam epitaxy (GS-MBE), metal organic chemical vapor deposition (MOCVD, or MOVPE), and atomic layer deposition (ALD). It is within the ordinary skill of practitioners of these methods to adjust the conditions so as to obtain an excess of Ga during growth.

EXAMPLES

Example 1

Growth of AlGaN Layers by Plasma Assisted MBE

Figure 2:
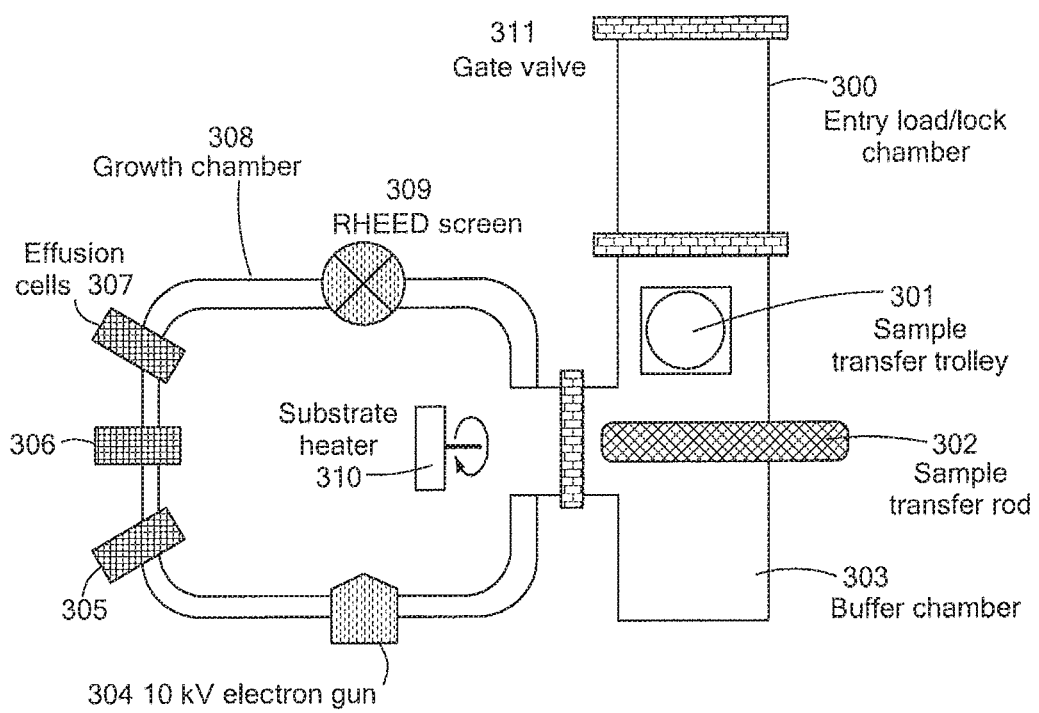
FIG. 2 shows a schematic representation of an apparatus for growth of AlGaN semiconductor material by plasma assisted MBE.

Plasma assisted MBE was used to deposit high quality single crystal epitaxial films of III-nitrides. The GenII MBE system used is depicted schematically in FIG. 2. Epitaxial growth was performed in an ultra high vacuum (UHV) environment (typically at $10^{-10}$ Torr), and therefore the background impurity level incorporated in the film was effectively reduced. The epitaxy proceeded by impinging "molecular beams" of constituent elements on the growth surface, where they arrive, diffuse, reevaporate and finally incorporate into the growing film. The molecular beams were supplied by heating furnaces (effusion cells 305, 306, 307, one for each metallic element, e.g., gallium, aluminum, and indium), where high purity pallets of the respective materials were stored in pyrolytic boron nitride crucibles, and heated up to their sublimation temperatures. Growth proceeded in the molecular flow regime in which evaporated atoms do not interact with each other in the vacuum chamber until they reach the growth surface, because of the long mean free paths of the atoms under vacuum. In front of each effusion cell there is a mechanical shutter (usually made of molybdenum or tantalum for chemical stability at high temperature up to 1400° C.) which can be either manually or computer controlled, allowing precise control of the chemical composition of the epitaxial layers produced. The growth rate of epitaxial films produced by MBE was generally less than 1 μm per hour.

Nitrogen was supplied in the form of molecular nitrogen radicals activated by an rf plasma source. An Applied Epi Uni-bulb plasma source was used to activate molecular nitrogen radicals, which contain metastable nitrogen species (atomic, anionic and $N_2$*). As compared to nitrogen in its molecular state ($N_2$), the active nitrogen radicals were excited to within one half an electronic volt of the molecular nitrogen bonding energy. The bond was thus easily broken at the growth front to facilitate the incorporation of nitrogen into the film.

Growth was monitored in situ by reflective high energy electron diffraction (RHEED). The RHEED system consisted of 10 kV electron gun 304, phosphor screen 309, and a camera. The incidence angle of the high energy electron beam is was typically at 0.5° to 2.5° with respect to the surface of the sample. The topmost atoms in the crystal lattice diffract the incident electrons because of the wavelike properties of electrons, and the diffracted electrons interfere constructively at specific angles depending on the crystal lattice structure, atomic spacing, and the wavelength of incident electrons. A RHEED pattern with streaky lines indicated a flat and smooth surface. The full width at half maximum of such lines also indicated the crystal quality of the film. A spotty RHEED pattern represented rough surfaces, and three-dimensional growth if the spots exhibited facetlike features. Metal accumulation on the surface showed a dim RHEED pattern, where the contrast was low and no distinct features could be clearly resolved. When the surface was free of metal the RHEED pattern was "clear", and the contrast between the background and the features (streaky lines or spots) was high.

The MBE growth chamber 308 was equipped with several effusion cells as well as nitrogen sources in order to support III-nitride epitaxy. The substrate heater 310 faced the effusion cells and was able to rotate during growth to improve lateral homogeneity. A magnetically-coupled trolley 301 was used to transfer samples in the system, and transfer rod 302 was used to load the sample onto the substrate heater. Gate valve 311 separated growth chamber 308 and buffer chamber 303, where the sample was degassed in high vacuum environment up to 500° C. The vacuum level in the buffer chamber was normally at $10^{-8}$ Torr. Another gate valve was used to separate the buffer chamber from the entry load/lock chamber, where the sample was introduced to the MBE system from outside under atmospheric condition after acid cleaning and chemical degreasing. The sample was degassed in the entry chamber at 140° C. until its pressure dropped to $10^{-7}$ Torr.

Example 2

Analysis of AlGaN Films and Semiconductor Structures

The III-nitride films and devices produced by plasma-assisted MBE were characterized by SEM and AFM imaging, X-ray diffraction, photoluminescence, cathode luminescence, and/or electroluminescence. A Zeiss Supra 40VP system was used for SEM imaging, and a Digital Instrument Dimension 3100 instrument was used for AFM For AFM, all samples were measured in the tapping mode using a Si etched SPM probe from Mikromasch. A Philips four-circle high resolution diffractometer was used for X-ray diffraction. The sample stage was able to rotate in three planes (w, w, and x), and the detector could rotate in the θ plane. Photoluminescence (PL) was used to evaluate the luminescence properties of the AlGaN materials, especially MQWs. The electron-hole pairs were generated by a laser. The emission profile was obtained by exciting the sample with photons above the optical band gap of the material. To excite AlGaN alloys emitting in the wavelength range of 260 nm to 300 nm, a PhotonSystem 70-224SL helium-silver deep UV laser with peak emission at 224.3 nm and peak intensity of 10 mW was used in pulsed mode as the excitation source. The luminescence was captured by a large diameter collimating lens focused onto an entrance slit of a 0.5 mm spectrometer by Acton Research Group containing a holographic grating with 1800 lines/mm blazed at 250 nm. The dispersed light was then directed to a photomultiplier, and converted to digital signal through an analogue-to-digital converter. In order to evaluate the IQE of AlGaN based MQWs as the active region of deep UV LEDs, temperature dependent PL was performed by mounting the sample onto the cold finger of a closed-cycle helium cryostat, equipped with a Si-diode temperature sensor and copper wire heating element. The minimum temperature that could be achieved with the cryostat was about 10K. The IQE was determined by dividing the room temperature (300K) PL intensity by the PL intensity acquired at 10K. Cathodoluminescence (CL) measurements were performed in a JEOL SEM system. The electron-hole pairs were generated by an electron beam placed inside the SEM system under vacuum. The electron beam could be precisely directed onto the sample surface, and the emission properties on different spots of the sample could be mapped in the form of a line scan. By changing the wavelength setting at the detector, the emission profile at specific wavelengths could be obtained from such a line scan. In addition, by changing the extraction voltage of the electron beam, the penetration depth of the electron beam can be changed, and therefore the emission profile at various depths of the sample could be obtained.

Example 3

Fabrication of LED Devices

Figure 3:
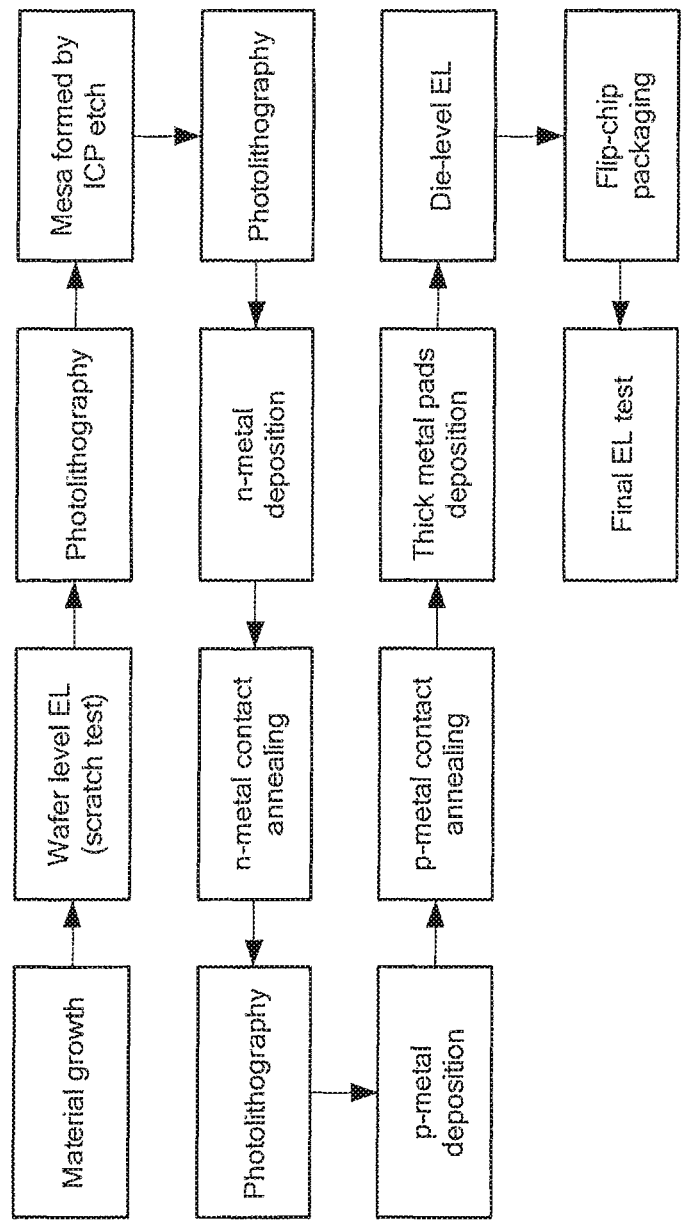
FIG. 3 shows a flow chart of a process for making an LED.

Light emitting diodes were fabricated from epitaxial films grown on sapphire substrates by standard device process techniques. LEDs with mesa-etched geometry designed for bottom light collection from the backside of the sapphire substrate were produced and their performance measured, as described in examples which follow. The electroluminescence (EL) properties of deep UV LEDs were obtained, including I-V characteristics, power spectra and L-I characteristics. Some devices were flip-chip packaged onto Si or AlN submounts. An overview of the fabrication process is presented in FIG. 3.

Example 4

Growth of Crack-Free Si-Doped AlGaN Films

During the growth of AlGaN films, atoms get incorporated at their point of arrival without sufficient lateral diffusion, resulting in a strained state. Therefore, stress is induced during crystallite coalescence, which cannot be relaxed, and cracks form at the grain boundaries. This can be seen in SEM of heavily Si-doped AlGaN films, as shown in FIG. 4. The cracks are found at grain boundaries of the film with hexagonal geometry and in-plane size of a few hundreds of nanometers, which is typical of the size of nucleation islands.

Because high Si doping introduces cracks in an n-type AlGaN film, there is a tradeoff between its structural quality and electron concentration. To allow for sufficient lateral current spreading in the n-AlGaN layer in a device structure, the total layer thickness should be more than 1 μm, and it should be doped sufficiently to have a moderately high electron concentration in the mid $10^{18}$ cm$^{-3}$ to produce electrons for injection and recombination. As a baseline experiment to investigate crack formation, a Si-doped AlGaN sample was grown with 55% AlN content directly onto a 100 nm thick MBE-grown AlN template on a sapphire substrate. The doping level was at $3\times10^{19}$ cm$^{-3}$, which corresponds to a Si effusion cell temperature of 1200° C. Growth of AlGaN was under stoichiometric conditions. A high density of cracks was observed on the surface with a thickness of the n-AlGaN layer of less than 1 as shown in FIG. 5A. Details of the epitaxial structure are schematically shown in FIG. 5B.

In order to address the cracking problem with n-doped AlGaN layers, three periods of AlGaN/AlN strain management superlattice (SL) were deposited after initial deposition of an AlN buffer on c-plane sapphire. However, as can be seen in FIG. 6A, the strain management SL did not eliminate cracking. FIG. 6B shows the epitaxial structure of the material shown in FIG. 6A. The n-AlGaN layer had the same Al content as the AlGaN template. The AlGaN and AlN layers were 24 nm and 8 nm thick, respectively. AlGaN was grown under stoichiometric conditions.

Next, a 1.5 μm thick Si-doped AlGaN layer was grown using a thick underlying AlN buffer layer of more than 2 μm thickness. The thick buffer layer was found to improve the structural quality of the epilayers grown on top of it, with reduced dislocation density. The layer was essentially crack free, as seen in FIG. 7A (epitaxial structure shown in FIG. 7B). Other n-type $Al_{0.6}Ga_{0.4}N$ samples produced in similar fashion also proved to be crack free with a thickness exceeding 1.5 μm. The resistivity of the sample was 0.02 Ω·cm, the electron concentration was $1.4\times10^{18}$ cm$^{-3}$, and mobility was 203 cm$^2$/Vs.

A combination of AlGaN/AlN superlattice and thick AlN buffer layer was also used to grow a thick, gradiently doped n-AlGaN template for deep UV LEDs. The total thickness of the n-type AlGaN was 2 with the first 1 μm doped at the mid-$10^{17}$ cm$^{-3}$ level, then another layer of 700 nm n-AlGaN doped at the mid-$10^{18}$ cm$^{-3}$, and finally a layer of 300 nm n-AlGaN doped degenerately at the low $10^{19}$ cm$^{-3}$ level close to the active region. Such a gradient doping profile was employed to avoid any abrupt change in Si impurity concentration. No cracks were observed across the entire wafer (see FIG. 8A, epitaxial structure in FIG. 8B). High doping concentration in the n-AlGaN layer is critical for carrier injection into the active region, and leads to marked enhancement in electroluminescence as compared to a moderately doped n-type layer. This design provides another alternative for obtaining a thick n-AlGaN layer without crack formation, while at the same time maintaining device performance by providing sufficient carriers near the active region.

Example 5

Growth of p-Type AlGaN Layers

In order to develop appropriate p-type doping for a deep UV LED, samples were grown by plasma-assisted MBE on (0001) sapphire substrates. Following nitridation, a high temperature AlN buffer layer of 100 nm thickness was deposited. To avoid abrupt in-plane strain transition, a 300 nm thick undoped $Al_yGa_{1-y}N$ layer with AlN mole fraction equal to that of the barrier layer in the $Al_xGa_{1-x}N/Al_yGa_{1-y}N$ superlattice was grown before growing the superlattice. The thickness of individual well and barrier layers was 5 nm. The Mg dopant concentration was on the order of $1\times10^{20}$ to $1\times10^{21}$ cm$^{-3}$. The superlattice was grown under Ga-rich conditions. The substrate temperature was 820° C., measured by a thermocouple placed at the backside of the substrate. Surface morphology of these AlGaN/AlGaN superlattice samples was characterized using SEM (See FIGS. 9A and 9B). The SEM image shown in FIG. 9A (p-$Al_{0.4}Ga_{0.6}$N/p-GaN SL) revealed plateau-like features, whereas that shown in FIG. 9B (p-$Al_{0.3}Ga_{0.7}$N/p-$Al_{0.1}Ga_{0.9}$N SL) exhibited a smooth surface. Plateau-like features observed on the surface of the sample of higher AlN mole fraction are thought to be due to regions where Ga—Al complexes were formed due to the limited diffusion length of Al atoms.

Figure 10:
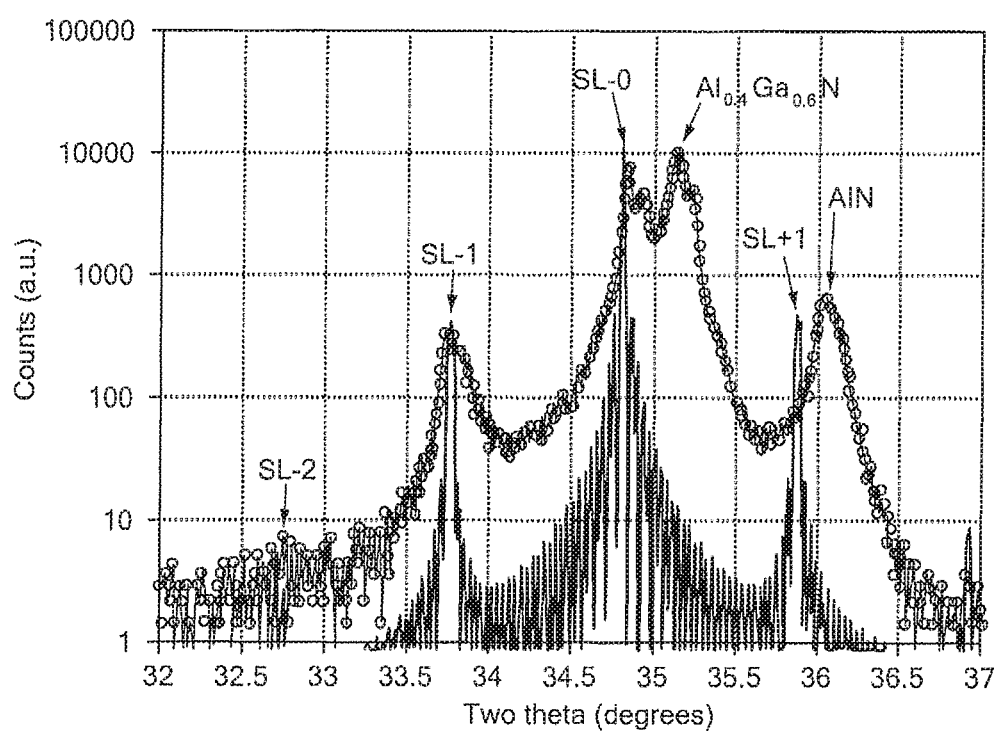
FIG. 10 shows an on-axis θ-2θ XRD scan of a Mg-doped $Al_{0.4}Ga_{0.6}N$/GaN superlattice.

To validate the formation of superlattice and evaluate the structural characteristics of these samples, on-axis θ-2θ XRD measurements were also performed. FIG. 10 shows the XRD intensity versus 2θ for the samples investigated. Strong superlattice peaks were observed up to the second order, indicating that high quality, well-defined superlattice layers were grown. The diffraction peaks of the $Al_{0.4}Ga_{0.6}$N and AlN buffer layers were observed as well. From kinematical simulation and by comparing the results with the XRD measurement, the thickness of individual $Al_{0.4}Ga_{0.6}$N and GaN layers was found to be 44 Å and 46 Å, respectively.

Example 6

Determination of IQE as a Function of Ga Excess Growth Condition

To investigate the relationship between excess Ga overlayer and IQE of the AlGaN quantum heterostructures grown by plasma-assisted MBE, samples were grown at identical conditions except for the Ga flux. All the samples were grown on (0001) sapphire substrates. Following nitridation of the sapphire substrate at high temperature (800° C.), a 2 μm thick AlN layer was deposited under stoichiometric conditions (the ratio of Al and N equal to 1). To minimize strain related polarization effects that may influence the emission wavelength and electron-hole wave function overlap, an undoped, 400 nm thick $Al_{0.5}Ga_{0.5}$N film was grown before the deposition of the QW structure under investigation, which had the same AlN mole fraction in the well layer as this undoped layer. In this growth sequence one expects the entire QW structure (15 pairs of $Al_{0.5}Ga_{0.5}$N/$Al_{0.65}Ga_{0.35}$N MQWs) to be coherently strained to the in-plane lattice constant of $Al_{0.5}Ga_{0.5}N$, and the well layer to be strain-free. The $Al_{0.5}Ga_{0.5}N$ undoped layer was grown at III/V ratio equal or less than 1 condition in order to differentiate its optical properties from those of the QW layer of the same AlN content. The thickness of the wells was 3 nm. To avoid coupling between QWs, and at the same time prevent carrier trapping in the barriers, the thickness of the $Al_{0.65}Ga_{0.35}N$ was also set at 3 nm. The epitaxial structure of the samples containing the AlGaN/AlGaN MQWs is schematically shown in FIG. 12.

In this experiment, the substrate temperature was 700° C., in the intermediate region between the optimal growth temperature for AlN (750° C.) and GaN (680° C.). The sticking coefficient of arriving Al atoms was 1 while for that Ga was less than 1 due to re-evaporation from the growth front. The III/V ratio during growth was monitored in situ by RHEED, where a bright, spotty diffraction pattern indicates nitrogen rich growth conditions, a bright and streaky diffraction pattern indicates slightly group III rich or near stoichiometric conditions, and a dim, streaky diffraction pattern indicates group III rich growth. To prevent formation of Ga droplets during growth under high Ga flux conditions, the growth was interrupted with the Ga and nitrogen shutters closed, until the surface was free of metal overlayer as indicated by a bright RHEED pattern.

Surface morphology of the samples was characterized by SEM. Direct correlation was established by evaluating the surface morphology with the Ga flux used in the growth. FIG. 13 shows the SEM images at 50,000× (FIG. 13A) and 20,000× (FIG. 13B) of sample V2666, which was grown with the lowest Ga flux (BEP $6.63\times10^{-7}$ Torr) corresponding to near stoichiometric conditions, whose growth mode as observed by RHEED was 3-dimensional. A high density of surface pits with average size of 200 nm were found, as indicated by black arrows, which can be attributed to insufficient Ga supply to complete film coalescence at grain boundaries. While Sampath et al. (U.S. Pat. No. 7,498,182) believed that luminescence enhancement from AlGaN bulk films with such morphology is due to compositional inhomogeneities related to such surface pits, the present inventors found CL and PL measurements that such pits actually reduce the luminescence efficiency of AlGaN-based QWs.

Sample V2658 was grown with increased Ga flux at BEP=$1.02\times10^{-6}$ Torr, which corresponded to intermediately Ga-rich conditions, and the RHEED showed an intermediately dim streaky pattern, indicating a two-dimensional growth mode. The surface morphology of this sample is shown in FIGS. 14A and 14B. Compared to the sample grown with insufficient Ga supply (shown in FIG. 13), V2658 showed a very smooth surface. Only a few shallow pits were observed in the 50,000× image, and a nitridated droplet was seen in the 20,000× image (indicated by arrows). The formation of such nitridated droplets is direct evidence for an oversupply of Ga, which did not change from metal into semiconductor. After growth is finished at high temperature, the unconverted Ga metal evaporates, leaving pits beneath the surface area that are converted into AlGaN (hexagonal shape).

With further increase of Ga flux during growth, the density of the nitridated droplet due to Ga oversupply increased, as shown in FIGS. 15 and 16. Different from the mechanism of surface pit formation in sample V2666 due to incomplete film coalescence at near stoichiometry conditions, the surface pits found in samples V2661 (Ga BEP=$1.53\times10^{-6}$ Torr) and V2665 (Ga BEP=$2.26\times10^{-6}$ Torr) are due to re-evaporation of excess Ga metal that is not converted to AlGaN. From the SEM images, the best surface morphology was obtained by growing under conditions where the amount of excess Ga was kept within a certain flux range that it is high enough to establish a complete coverage of the sample surface but low enough to prevent droplet formation.

To evaluate luminescence properties of the MQWs grown at different Ga fluxes, CL measurements were carried out with an electron beam energy of 2 keV to probe the surface emission of the MQWs. The scan area of the electron beam was 500 μm×500 μm, which was wide enough to guarantee the statistical nature of luminescence data from the measurement.

The luminescence spectra of these samples are plotted together in FIG. 17. All spectra exhibit strong Stokes-type wavelength shift with respect to their absorption band edges. At the same electron injection conditions, Sample V2658 grown at intermediate Ga-rich condition (Ga BEP of $1.02\times10^{-6}$ Torr) was the brightest, with peak wavelength at 299 nm and a shoulder at 285 nm. Note that the shoulder emission peaks at the same position with sample V2666 grown at near stoichiometric condition (Ga BEP of $6.63\times10^{-7}$ Torr), which is free of potential fluctuation induced by excess Ga. The double peak emission spectra of sample V2658 clearly indicates formation of potential fluctuation due to increased Ga overlayer thickness, which confines excitons at the potential minima and recombine radiatively with higher efficiency at longer wavelength than sample regions without such potential fluctuation. The emission at 299 nm (main peak) is about 3 times brighter than at 285 nm in V2658 (shoulder peak) and in V2666 (main peak). Such difference in emission peak intensity suggests that radiative recombination by localized excitons in regions with potential fluctuation is more efficient than in regions without. In fact, it can be expected that with increasing Ga flux beyond the one used in growing V2658, the shoulder peak at 285 nm will disappear and the emission spectra will be dominated by the peak at 299 nm. However, from the CL spectra of sample V2661 and V2665, which were both grown at higher Ga fluxes (BEP @ $1.53\times10^{-6}$ Torr and $2.23\times10^{-6}$ Torr), it appears that a Ga overlayer can only help increase radiative recombination within a certain range of excess Ga present at the growth front. The emission peak intensity at 299 nm of V2661 was half of that of V2658, and a broad side peak arose at around 360 nm. In sample V2665, the peak at 299 nm was much weaker than the broad peak at around 360 nm. When the Ga overlayer exceeds a certain critical thickness, the Ga solution cannot be saturated by arriving Al atoms, but instead directly bonds with active nitrogen, and Ga droplets can form within the AlGaN layer with only its surface converted to GaN quantum dots or quantum disks. Since GaN has a much lower band gap than a AlGaN well layer, the carrier confinement at these quantum dot or disk sites is more effective than potential fluctuations in the AlGaN material. Such quantum dots or disks will compete with the AlGaN material in carrier recombination, leading to significant reduction in emission intensity at the desired deep UV wavelength.

Example 7

Design of High Efficiency Deep UV LEDs

Figure 18:
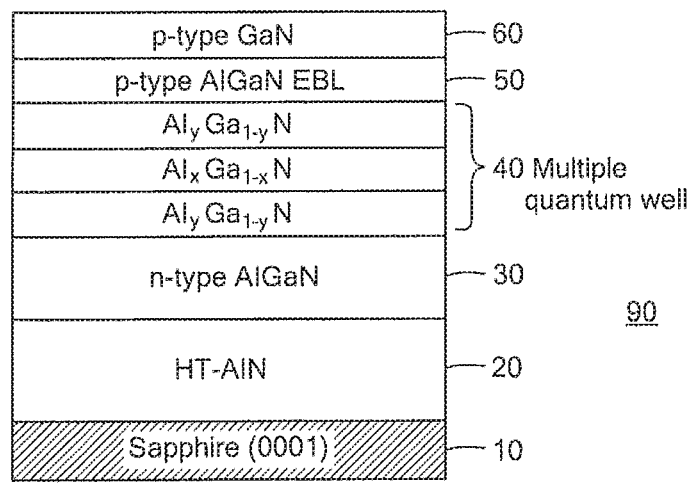
FIG. 18 shows a diagram of the epitaxial structure of a generic UV LED.

A basic deep UV LED structure is shown schematically in FIG. 18. To make the LED, the (0001) sapphire substrate was first nitridated at high temperature for at least 1 hour in order to convert its surface layers from $Al_2O_3$ to AlN. A high temperature AlN buffer layer was then grown directly onto the nitridated substrate before deposition of the n-type AlGaN layer. Standard MQW structure was used as the active region of the device, where the injected carriers from the n- and p-side are confined and recombine radiatively. Similar to blueviolet LEDs, to block the electron overflow into the p-layers, an electron blocking layer (EBL) was inserted between the p-GaN layer and the last barrier in the active region. Finally the device was capped with a Mg-doped GaN layer as a contact layer.

Figure 19:
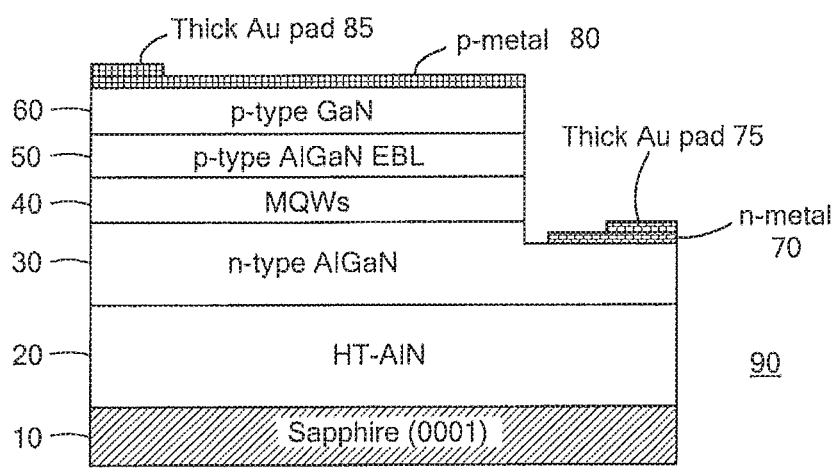
FIG. 19 shows a diagram of a UV LED with contacts attached, for use in assessing wafer-level electroluminescence.

After the device structure was grown, the epitaxial film was then processed using standard photolithography techniques. In order to conduct the n-layer, mesa structures were formed by etching the film with inductively coupled Cl-plasma etching. Metal contacts were then selectively deposited onto the surfaces of the exposed n-layer and un-etched p-layer. As n-contact, either vanadium-based or titanium-based metal stacks were used, together with heat annealing both metal stacks in order to achieve Ohmic contact. Ni/Au metal stack was used as a p-contact and was typically annealed at 500° C. to form Ohmic contact to p-GaN. The LED structure processed with mesa structure is shown in FIG. 19.

Figure 20:
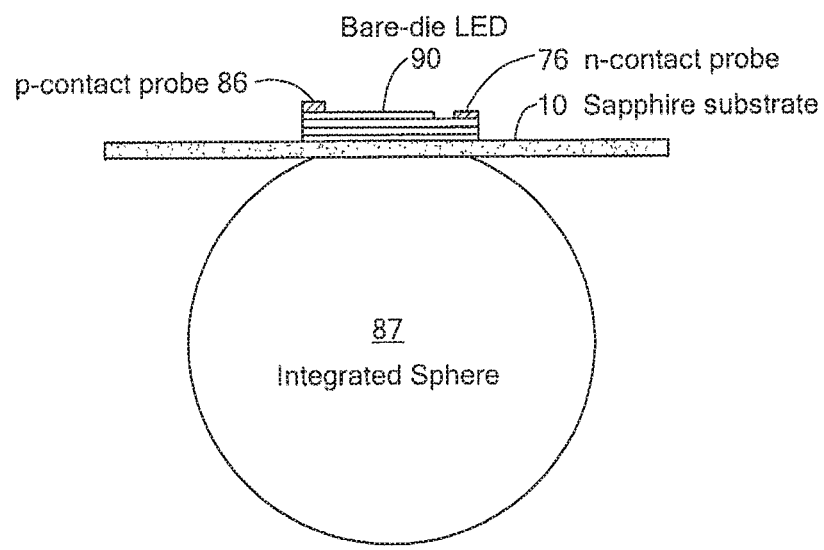
FIG. 20 shows a diagram of an experimental set up used for measuring wafer-level electroluminescence.

To evaluate device performance at the die-level, prior to flip-chip packaging, electroluminescence (EL) measurement was performed on each die 90 of a multi-die wafer. The set-up is shown in FIG. 20. Light emission was collected through the back side of sapphire substrate 10 into integrated sphere 87. P-contact probe 86 and n-contact probe 76 were used to establish electrical contact to the metal pads of the die. For these experiments, the device was not inserted into the calibration sphere, and thus the amount of collected light was only a small fraction of the emitted light. This is partly due to the change of the band structure of AlGaN alloys as the mole fraction of AlN increases, which influences the emission properties. Since the AlN mole fraction in the active region of the tested devices was more than 50%, a significant amount of the emitted light was parallel to the surface of the die. In addition, only a small fraction of the surface emitted light arrives at the integrated sphere due to light coupling into the sapphire substrate and scattering from the rough surface on the back side of the sapphire substrate. No geometrical factor was used to correct such output power loss. Thus, the evaluation of the device greatly underestimated its real optical power. In some experiments, devices were flip-chip mounted and lowered into the integrated sphere to provide more complete light collection.

Figure 21:
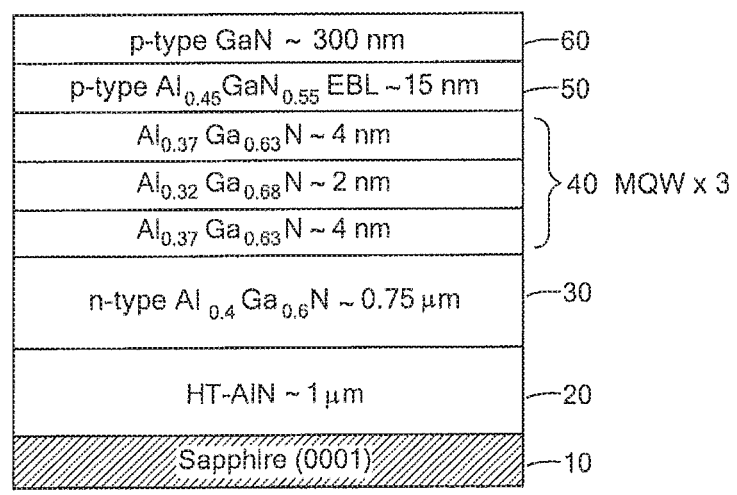
FIG. 21 shows a diagram of the epitaxial structure of an LED emitting at 322 nm.

FIG. 21 shows an epitaxial diagram for a mid-UV LED with relatively low AlN mole fraction in the QW of 32%, emitting at 320 nm. A MQW was employed in the active region. The n-AlGaN cladding layer was doped with Si at the mid-$10^{18}$ cm$^{-3}$ level, with Si cell temperature at 1160° C. The Mg doping level in the p-GaN and the EBL was about $3\times10^{17}$ cm$^{-3}$, which corresponds to a Mg cell temperature of 330° C. Thicknesses of the epitaxial layers are indicated in the figure. All epitaxial layers were grown under extremely Ga-rich conditions, with the BEP of Ga at $3.1\times10^{-6}$ Torr.

Figure 22:
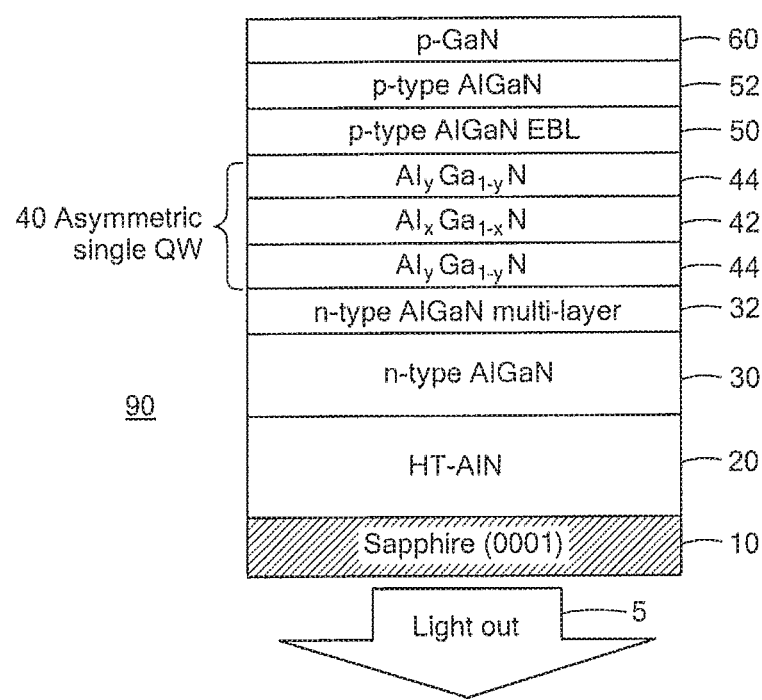
FIG. 22 shows a diagram of the epitaxial structure of an asymmetric single quantum well deep UV LED incorporating an n-type AlGaN multilayer in the n-region and a single p-type AlGaN layer in the p-region.

A typical epitaxial structure for a deep UV LED is shown in FIG. 22. The design uses an asymmetric single QW structure as the active region of the deep UV LED. Because the activation of Mg acceptors is very inefficient, the p-type AlGaN EBL is not sufficiently doped, even at high Mg fluxes. This makes hole injection difficult by placing a potential barrier between the QW and the p-GaN. In addition, because the hole effective mass is much larger than that of the electron in AlGaN, the hole mobility is much smaller compared to that of the electron. An asymmetric single QW (SQW) design comprising different thickness of barrier layers can be used to compensate the difference in mobility between electrons and holes. Specifically, the thickness of the barrier layer adjacent to the n-AlGaN is increased while the thickness of the barrier layer adjacent to the p-AlGaN EBL is decreased. To prevent carrier overflow during high current density operation, the thickness of the QW is increased from 2 nm to 3 nm and 5 nm. Mg dopant activation can be greatly enhanced by introducing polarization fields at the interfaces of AlGaN/AlGaN heterostructure/superlattices. A Mg-doped AlGaN layer was inserted between the p-AlGaN EBL and the p-GaN, whose AlN mole fraction was half of that in the p-AlGaN EBL. The insertion of this layer introduced two interfaces between the p-AlGaN and p-GaN layers, where both piezoelectric and spontaneous polarizations are present. This led to formation of two interfaces with high hole concentration in the form of 2DHG. On the n-side of the device, prior to deposition of n-AlGaN, a ten period strain management superlattice was introduced in order to grow thicker n-AlGaN with heavy doping without generating cracks. Similar to the p-side, a polarization enhanced Si-doped AlGaN/AlGaN superlattice was inserted between bulk n-AlGaN and the QW barrier next to the n-side. Si donor activation was increased, and high electron concentration at the interfaces could be achieved.

The conventional device illustrated in FIG. 23 includes the following layers arranged on a substrate: AlN buffer layer 1a, n-Al$_a$Ga$_{1-a}$N layer 2a, Al$_y$Ga$_{1-y}$N layer 3a, Al$_x$Ga$_{1-x}$N layer 4a, Al$_y$Ga$_{1-y}$N layer 5a, p-Al$_b$Ga$_{1-b}$N layer 6a, p-Al$_c$Ga$_{1-c}$N layer 7a, and p-GaN layer 8a. The device illustrated in FIG. 24A includes the following layers arranged on a substrate 0b: HT AlN layer 1b, gradiently doped n-Al$_a$Ga$_{1-a}$N layer 2b, n-Al$_a$Ga$_{1-a}$N layer 3b, n-Al$_c$Ga$_{1-c}$N layer 4b, n-Al$_a$Ga$_{1-a}$N layer 5b, Al$_y$Ga$_{1-y}$N layer 6b, Al$_x$Ga$_{1-x}$N layer 7b, Al$_y$Ga$_{1-y}$N layer 8b, p-AlGaN EBL 9b, p-AlGaN layer 10b, and p-GaN layer 11b.

Figure 23A:
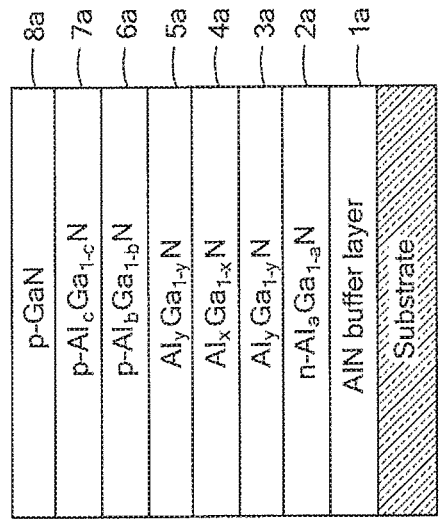
FIG. 23A shows the AlN mole fraction by layer for a conventional LED design, shown in FIG. 23B, with higher energy gap for n-type AlGaN than for the AlGaN QW barrier layer.
Figure 23B:
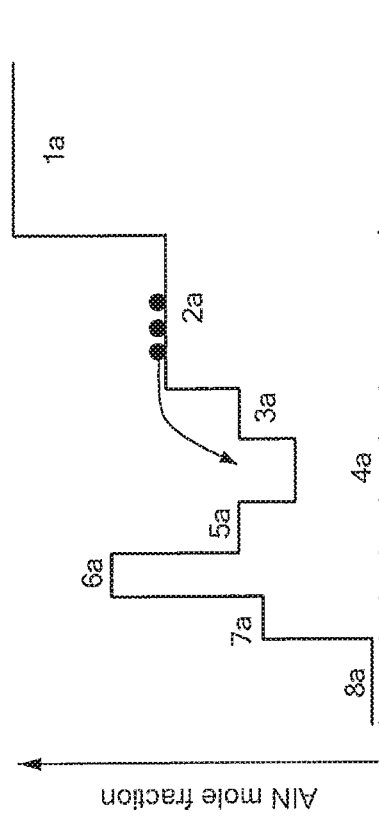
Figure 24A:
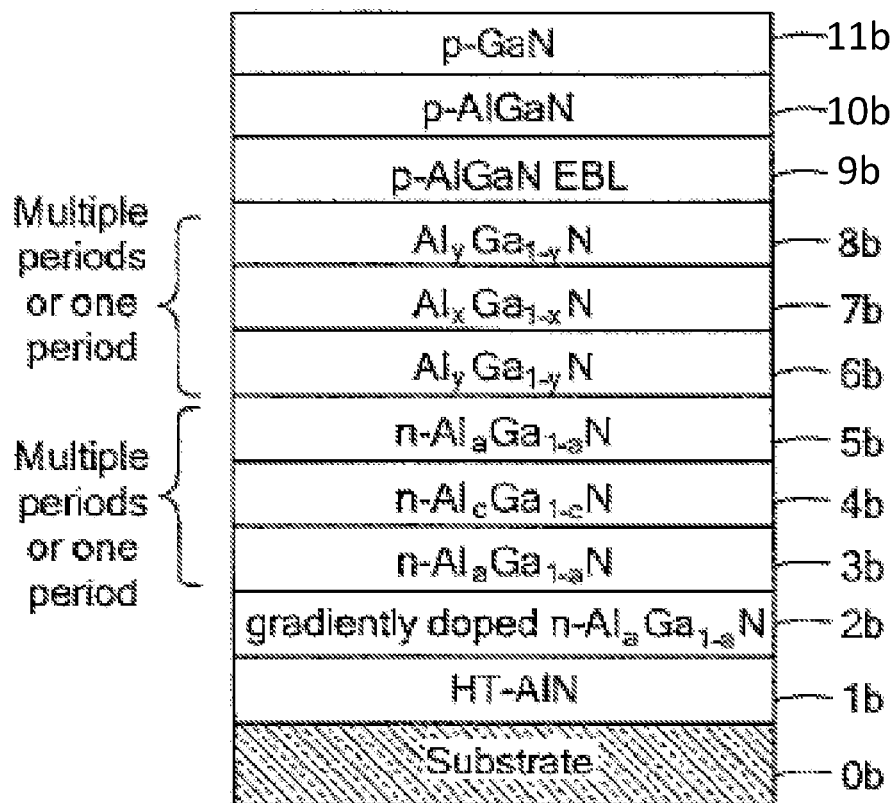
FIG. 24A shows the AlN mole fraction by layer for a sub-300 nm LED design, shown in FIG. 24B, with smaller energy gap for n-AlGaN than for the AlGaN QW and three layer n-type AlGaN structure next to the first barrier to enhance electron injection.
Figure 24C:
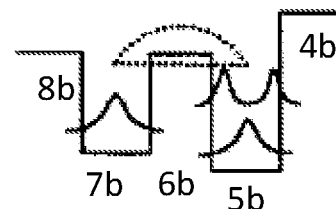
FIG. 24C is an expanded view of a portion of FIG. 24B.
Figure 24B:
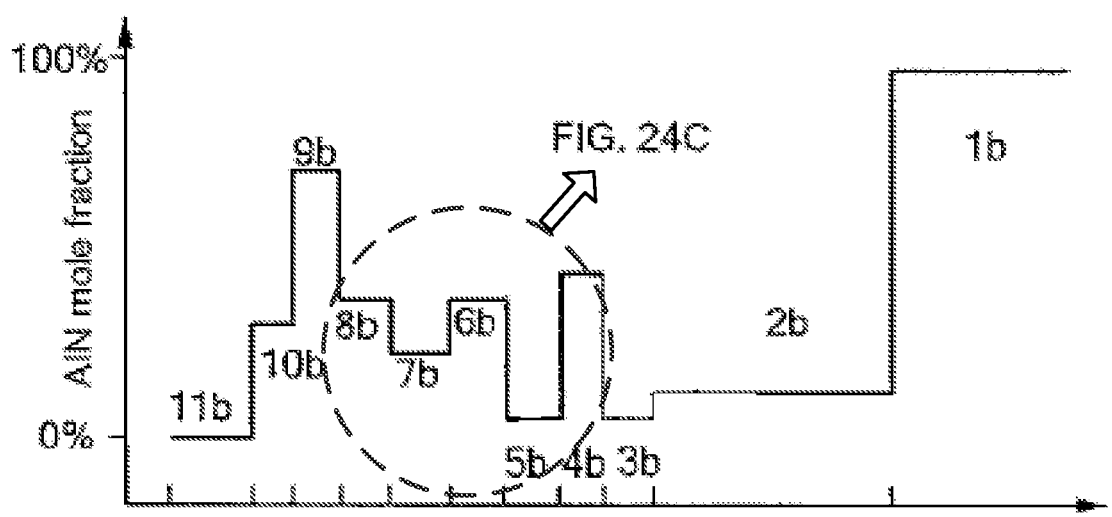

FIG. 24 shows a design for efficient deep UV LEDs emitting in the wavelength range below 300 nm. Naturally, higher AlN mole fraction is needed in the AlGaN alloy to increase the band gap of the material. However, because of larger Si donor activation energy, the resistivity of n-AlGaN increases with increasing AlN mole fraction, making such n-AlGaN layers unsuitable for device applications. Significant Stokes-shift was observed (as large as 20 nm) from light emission in AlGaN QWs grown with excess Ga to produce potential fluctuations. Consequently, to allow for bottom side light extraction, the AlN mole fraction needed in the n-AlGaN layer does not have to exceed that of the QW layer, but just enough that the emitted light from the QW can be transmitted through the n-AlGaN without absorption. This allows for significant reduction of the AlN content in n-AlGaN, which reduces n-AlGaN resistivity and increases the electron concentration exponentially. It is important to note that, conventional UV-LED designs require the energy gap of the n-AlGaN be higher than that of the QW barrier, in order to facilitate electron injection into the QW without seeing any potential barrier. Here, because the QW emission is significantly red-shifted and high AlN mole fraction AlGaN cannot be doped degenerately with high thickness and without cracking, the tradeoff between electron injection efficiency and n-AlGaN resistivity must be balanced. A comparison between a deep UV LED structure according to the present invention (with less AlN content in the n-AlGaN than in the QW) and a conventional LED structure (with more AlN content in the n-AlGaN than in the QW) can be made by comparing FIG. 23A and FIG. 23B, showing the conventional structure, and FIGS. 24A and 24B, showing the design according to the invention.

Figure 25:
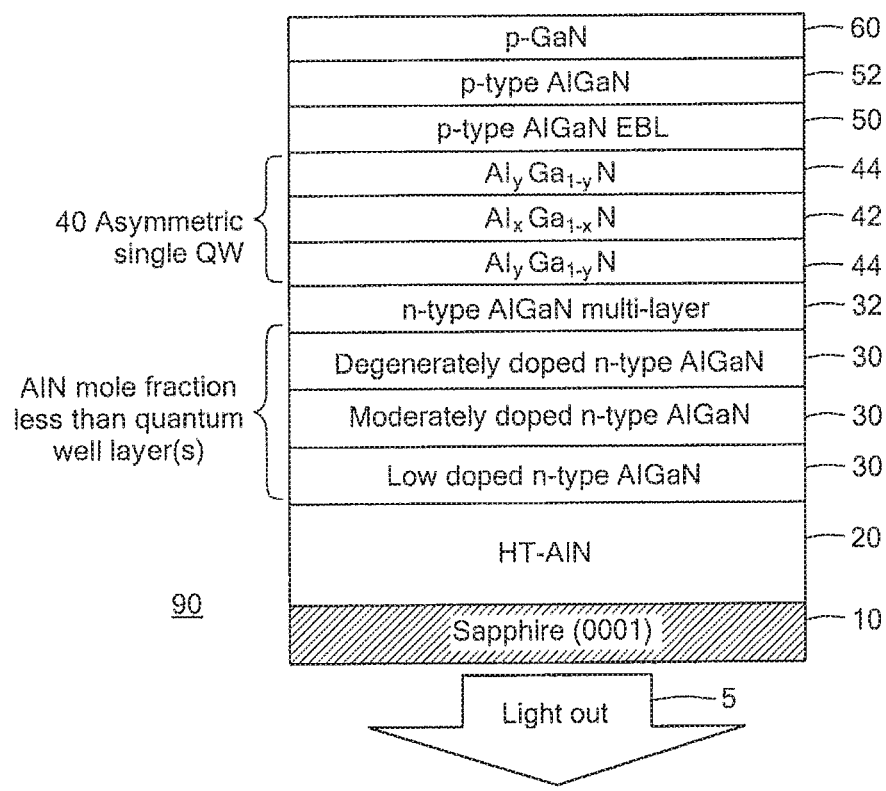
FIG. 25 shows a diagram of the epitaxial structure of a sub-300 nm deep UV LED with lower AlN mole fraction in the n-AlGaN layer(s) than in the active region.

A deep UV LED design featuring improved electron injection efficiency is shown in FIG. 25. The LED uses a novel polarization doping design in the n-AlGaN layer adjacent to the QW barrier. The n-type polarization doping multilayer is different from superlattice structures comprising many pairs of AlGaN/AlGaN layers, which reduce the vertical conductivity. Instead, this novel design for sub-300 nm LEDs includes only three layers of such n-AlGaN. One of these AlGaN layers has AlN content equal to or higher than the QW barrier to increase the potential energy of the mini-bands in these layers to facilitate electron injection. The other two layers have less AlN content and are doped degenerately with Si, and act as "electron reservoirs" for carrier injection. The electron injection in this design is made possible by tunneling and electron overflow at biased conditions (shown in the inset expanded view of FIG. 24C).

More specifically, in FIGS. 24A, 24B, and 24C, a light emitting QW active layer 7b is sandwiched between two QW barrier layers 6b and 8b. A first layer 5b, adjacent to the QW barrier layer 6b, is an n-type AlGaN layer with a bandgap lower than the bandgap in the QW active layer 7b due to an AlN mole fraction lower than that of the QW active layer 7b. An n-type second layer 4b is between the first layer 5b and an n-type third layer 3b and has a bandgap higher than the bandgap of the QW barrier layer 6b due to having a larger AlN mole fraction. The first layer 5b and third layer 3b act as electron reservoirs. There is electron tunneling through the QB barrier layer 6b from the first layer 5b.

Example 8

Functional Characterization of Deep UV LEDs

Figure 26:
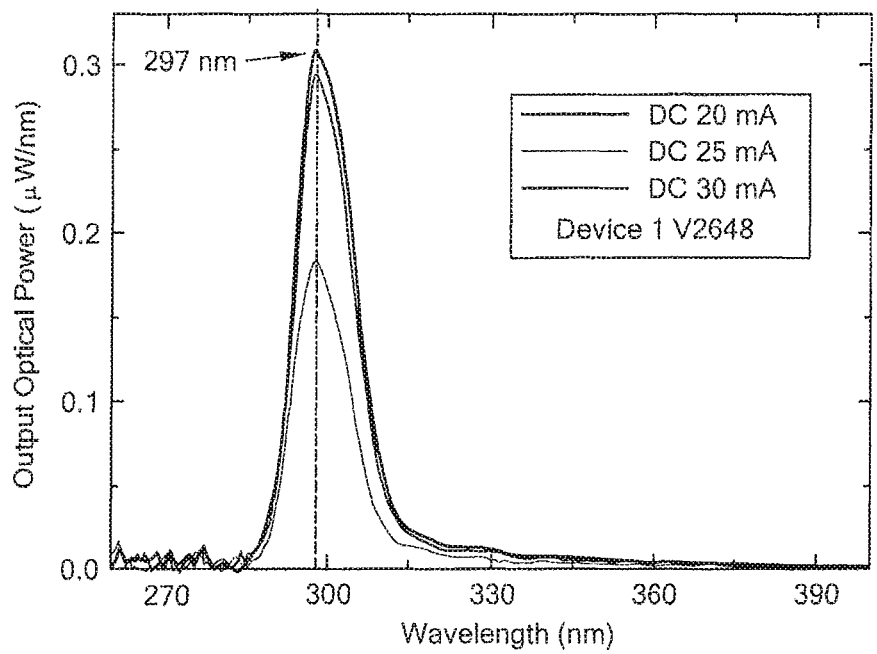
FIG. 26 shows electroluminescence spectra of an LED device according to the invention, under continuous wave carrier injection.

The baseline sample for this series of experiment is sample V2648. The n-AlGaN layer was doped by a step profile with 3 doping levels corresponding to Si cell temperatures at 1100° C., 1150° C. and 1180° C., respectively. Such step-profile doping was used to increase the total thickness of the n-AlGaN layer without generating cracks. The doping level of the last layer was increased to corresponding Si cell temperature at 1180° C. to produce high electron concentration and facilitate Ohmic contact formation. Prior to deposition of the active region, two layers of Si-doped $Al_{0.45}Ga_{0.55}N$ film and a single $Al_{0.65}Ga_{0.35}N$ film were inserted between the QW barrier and the n-AlGaN layer. These three layers of Si-doped AlGaN films act as polarization doping layers where Si donor activation is increased by further reducing the AlN mole fraction and introducing polarization fields (piezoelectric and spontaneous). The thickness of individual layers in the 3-layer AlGaN film was 5 nm. Notice also that the Mg doping was increased by changing corresponding cell temperature from 340° C. to 360° C. The EL spectrum of device #1 processed from sample V2648 is shown in FIG. 26. This device emits at 297 nm with no parasitic emission at longer wavelengths. The optical output power of device(s) processed from this sample was quite low, for reasons that can be attributed to high resistivity in 60% n-AlGaN film.

Figure 27:
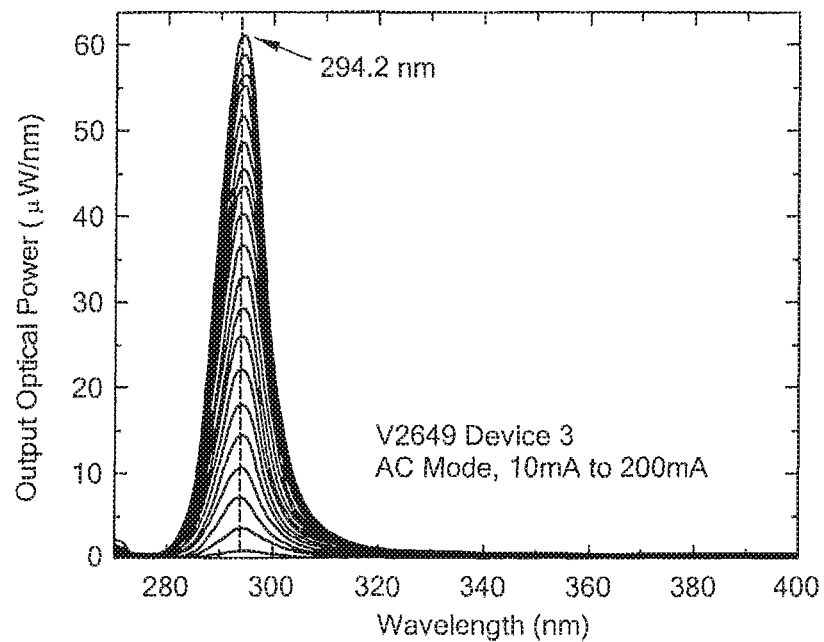
FIG. 27 shows electroluminescence spectra of an LED device according to the invention under AC injection current from 10 mA to 200 mA.
Figure 28:
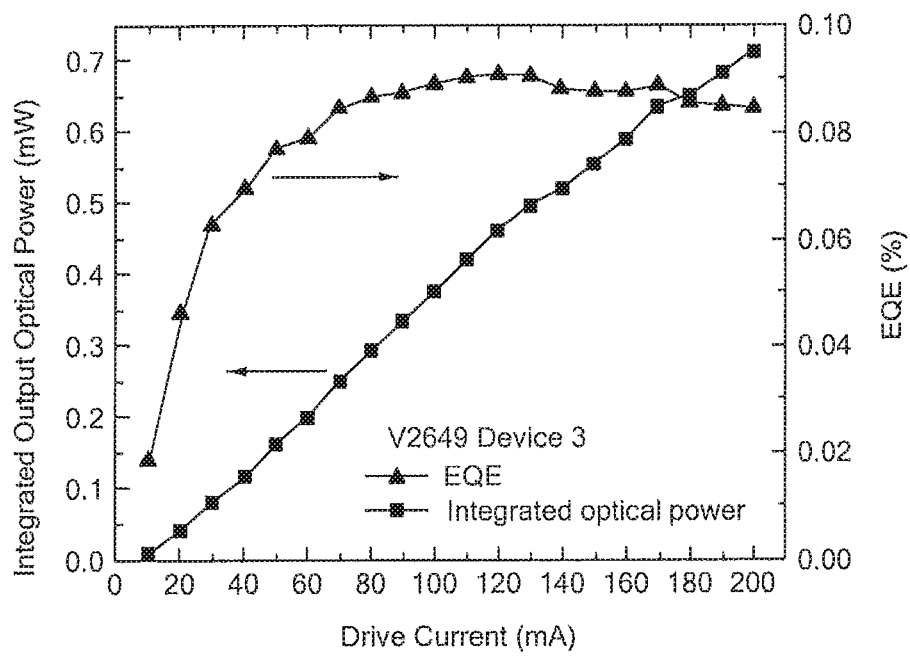
FIG. 28 shows the integrated optical output power and EQE of the device whose spectra are shown in FIG. 27, under AC current injection from 10 mA to 200 mA.
Figure 29:
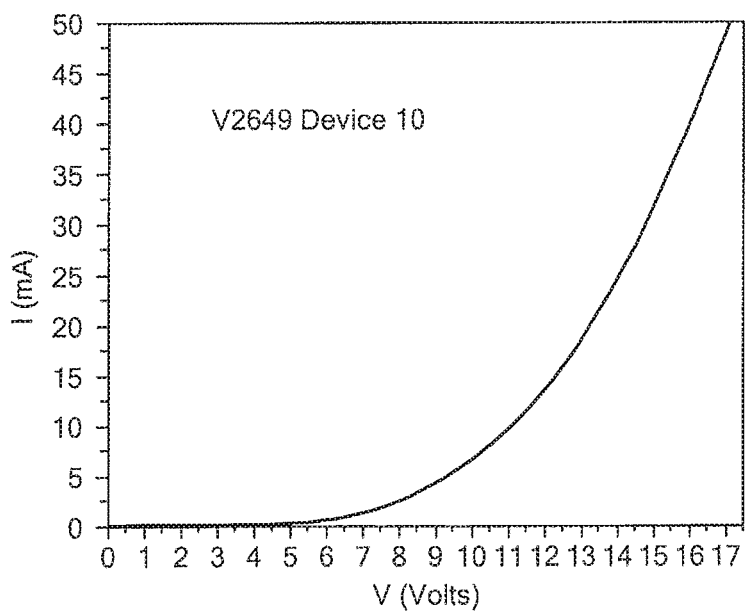
FIG. 29 shows the I-V characteristics of an LED device according to the invention.

Sample V2649 was grown after the baseline sample V2648 with a number of design changes. First, the AlN mole fraction of the n-AlGaN in the polarization doping barrier layer was increased to 70%. This increase further enhanced the piezoelectric and spontaneous polarization at the n-$Al_{0.45}Ga_{0.55}N/Al_{0.70}Ga_{0.30}N$ interface, and consequently higher electron concentration could be obtained. Also, the QW was made deeper by keeping the same AlN mole fraction in the barrier and reducing the AlN mole fraction in the well layer by 5%. In general, a deeper QW provides more states for electron occupation and thus prevents carrier from escaping. The EL spectrum of device #3 processed from sample V2649 is shown in FIG. 27. The emission peaks at 294 nm, with no parasitic emission at longer wavelengths. The integrated optical output power and EQE of this device is shown in FIG. 28. The injection current was increased from 10 mA to 200 mA at 5% duty cycle. The output power reached 0.7 mW at 200 mA injection current, and the EQE peaked at 0.09% at 120 mA injection current. The I-V characteristics of device #10 processed from sample V2649 are shown in FIG. 29.

Figure 30:
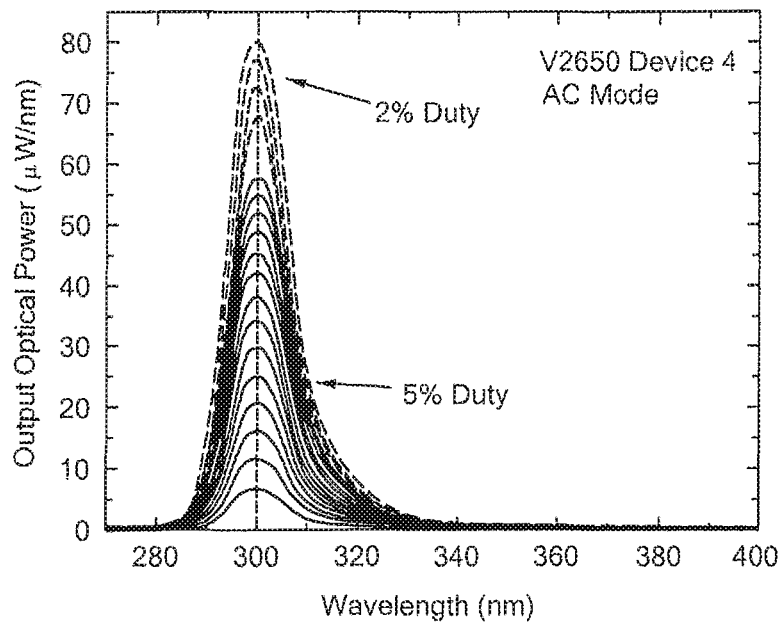
FIG. 30 shows electroluminescence spectra of an LED device according to the invention under AC injection current at 2% and 5% duty cycles.
Figure 31:
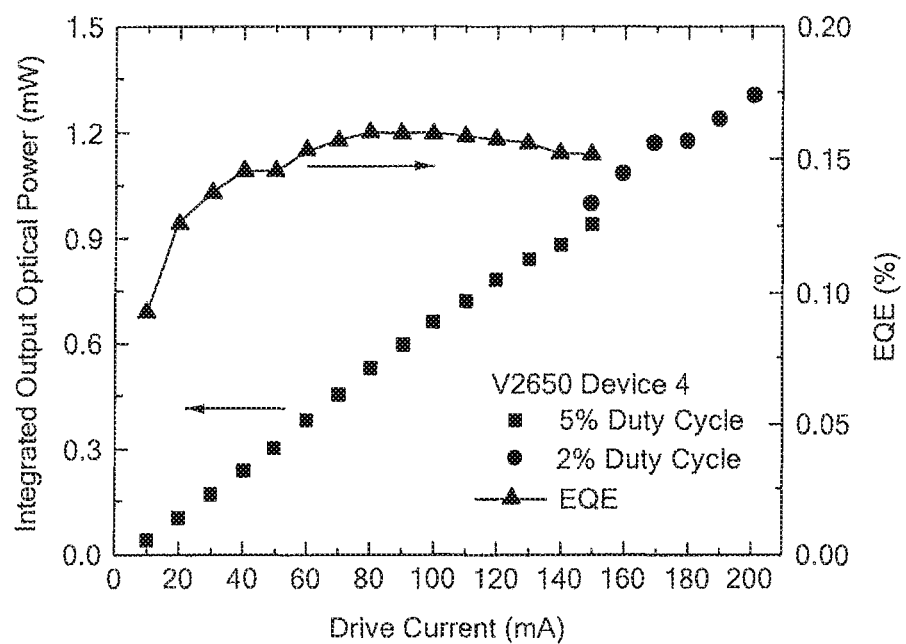
FIG. 31 shows the integrated optical output power and EQE as a function of the driving current for the LED device whose spectra are shown in FIG. 30.

To further evaluate the influence of QW depth on deep UV LED performance, sample V2650 was grown by keeping all growth parameters the same as V2649 except for the AlN mole fraction in the QW layer. By reducing the AlN mole fraction to 50% in the QW and keeping the barrier the same, the depth of the QW was increased to 15%. The EL spectrum of device #4 processed from sample V2650 is shown in FIG. 30. The device was evaluated in the AC mode at 5% (10 mA to 140 mA) and 2% (140 mA to 200 mA) duty cycles. Single peak emission at 300 nm was observed, and the emission peak position did not shift either to shorter wavelength or to longer wavelength, indicating that neither self-heating nor band-filling was affecting the device performance. The output power and EQE of this device as a function of injection current is plotted in FIG. 31. The output power reached 1.3 mW at 200 mA, and the EQE peaked at 0.16% at 80 mA. After flip-chip packaging a 3× improvement is expected. Therefore, the EQE of this device after flip-chip packaging is estimated to be 0.5%, which is at the same level of commercial deep UV LEDs.

Figure 32:
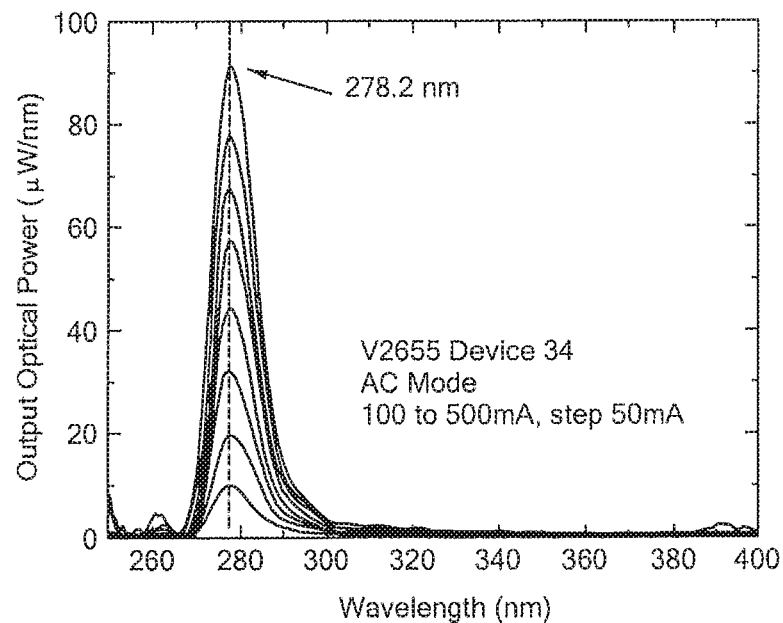
FIG. 32 shows electroluminescence spectra of an LED device according to the invention under AC injection current as indicated.
Figure 33:
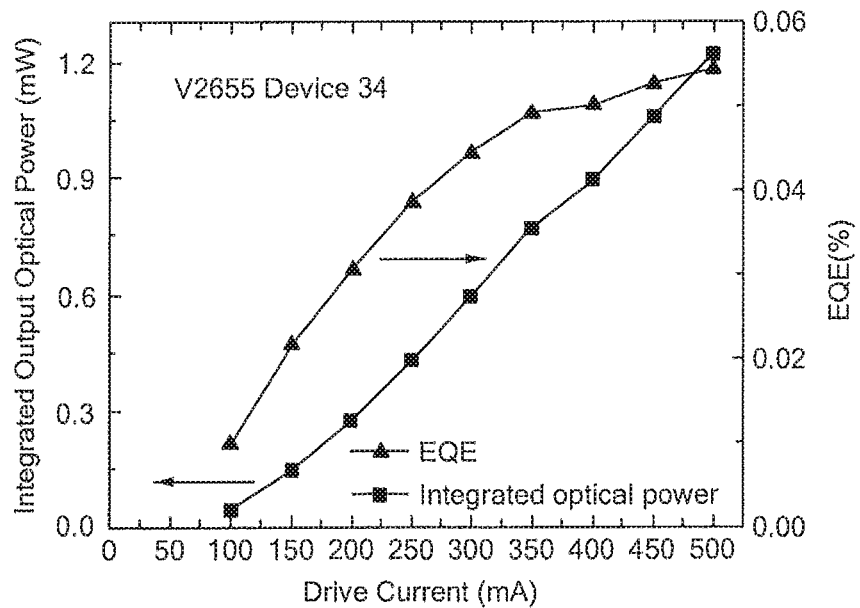
FIG. 33 shows the integrated optical output power and EQE as a function of the driving current for the LED device whose spectra are shown in FIG. 32.

Having demonstrated efficient deep UV emission at 290 nm, the AlN mole fraction in the epitaxial layers was further increased to extend emission into deeper UV wavelengths. Sample V2655 was grown following the same design principle as that of V2650. The AlN mole fraction in the well and barrier of the QW were increased to 70% and 80%, respectively. The n-AlGaN polarization doping layers were changed from $Al_{0.45}Ga_{0.55}N/Al_{0.70}Ga_{0.30}N$ to $Al_{0.55}Ga_{0.45}N/Al_{0.85}Ga_{0.15}N$. The AlN mole fraction in the EBL was increased to 85%. The EL spectrum of device #34 processed from sample V2655 is shown in FIG. 32. Single peak emission at 278 nm was achieved without parasitic emission at longer wavelengths. However, the drive current needed to obtain milliwatt-level output power was significantly higher than previous devices due to increased device resistance. The integrated optical output power and EQE of this device as a function of drive current are plotted in FIG. 33. Much higher current (larger than 100 mA) is needed to drive such devices. This is primarily due to deeper acceptor levels in the Mg-doped EBL and p-AlGaN layers, which require a certain amount of self-heating to be activated. At 500 mA the integrated optical output power reached 1.3 mW, which corresponds to an EQE of 0.055%.

Figure 34:
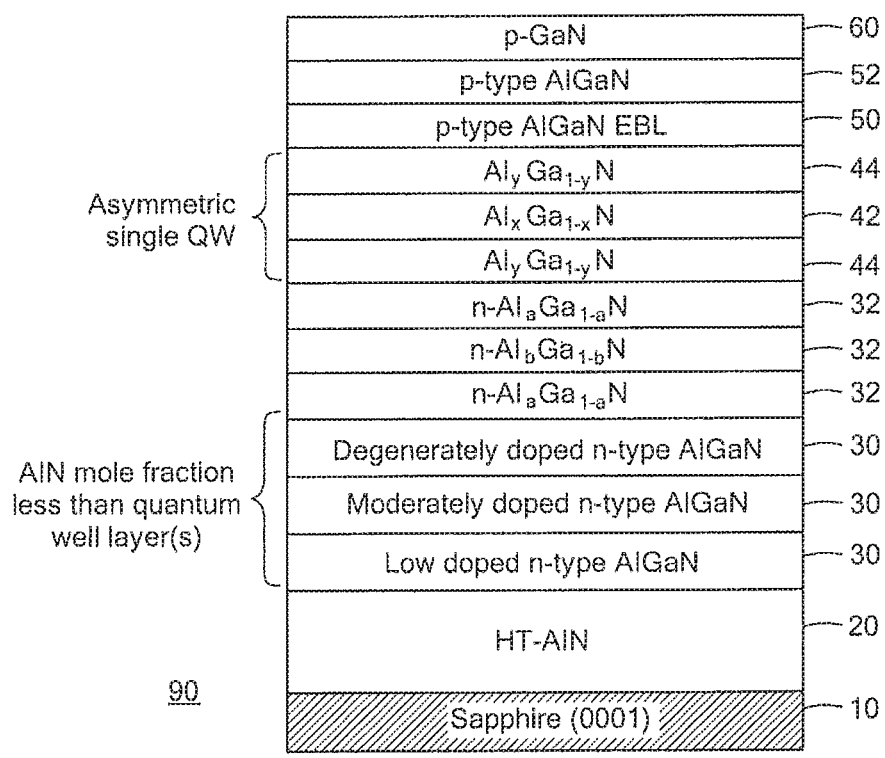
FIG. 34 shows a diagram of the epitaxial structure of LEDs used to investigate the influence of gallium flux on device performance.

In Example 6 the influence of excess Ga on the emission properties of AlGaN-based QWs was evaluated by CL and temperature dependent PL measurements. The emission peak wavelength and IQE of the AlGaN-based QWs were found to depend strongly on the excess Ga used in the epitaxial growth. The amount of excess Ga at the growth front has to be high enough that the growth front is entirely covered by excess Ga and local variations of Ga-excess can be sustained to create band structure potential fluctuations in the QW. Here, similar experiments were carried out at the level of deep UV LEDs. The influence of excess Ga used in the active region on deep UV LED performance was evaluated by incorporating the AlGaN QWs previously investigated into identical LED device structures. The device structure and growth conditions (except for the active region) are the same as V2677, except that the AlGaN/AlN strain management superlattice was removed to simply the growth process. Only Ga flux was changed in the growth of the quantum well and/or barrier layers of these devices. The deep UV LED structure is shown in FIG. 34.

Wafer-level EL spectra of these samples were measured, and all samples showed single peak emission at between 273 and 292 nm, without side emission at longer wavelengths. It is important to note that the AlN mole fraction in the QW is the same for all 4 samples investigated. Therefore, the peak shift is entirely due to the variation of Ga fluxes used in growth of the active region. However, contrary to previous findings in the similar experiment performed in Example 6 with only QW samples, with decreasing Ga flux in the well region (sample V2709) the emission peak red-shifted from 273 to 288 nm. Such abnormal red-shift with decreasing Ga flux in the well layer can be explained by device self-heating due to inefficient recombination of carriers in QW grown with less Ga, and therefore band gap shrinkage.

Figure 35:
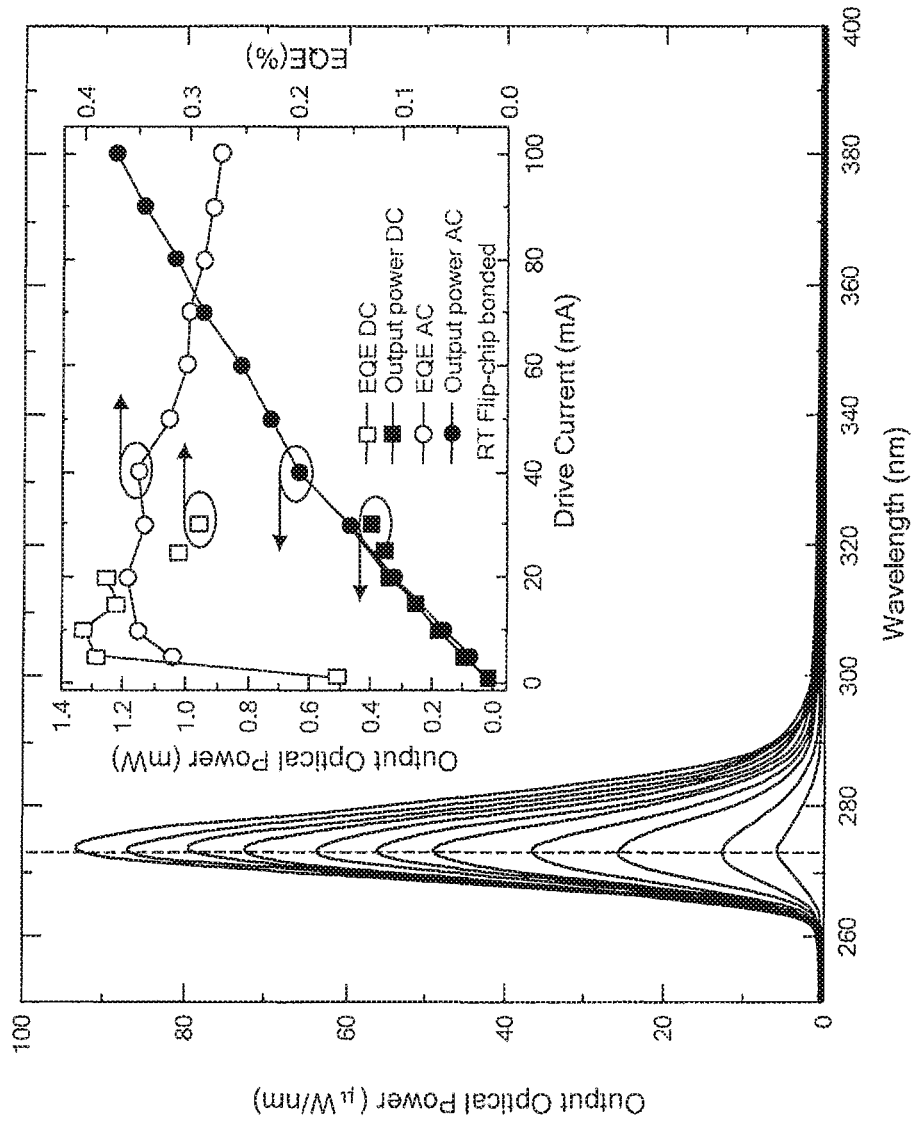
FIG. 35 shows electroluminescence spectra of a 273 nm LED device according to the invention under AC injection current. The inset shows the L-I characteristics and EQE of the device under continuous wave AC injection current.

Standard device processing was performed on sample V2706 to evaluate its performance after flip-chip bonding. The EL spectrum and L-I characteristics of device #F1 processed from sample V2706 are shown in FIG. 35. Single peak emission with a full width half maximum value of 9 nm was observed without parasitic long wavelength emission. The optical output power and EQE of this device under both continuous and pulsed injection current are shown in the inset of FIG. 35. At 25 mA continuous wave injection current, the device emitted 0.38 mW and reached 1.3 mW at 100 mA pulsed current at 10% duty cycle. The EQE of this device peaked at 0.4% in the continuous wave mode.

Figure 36:
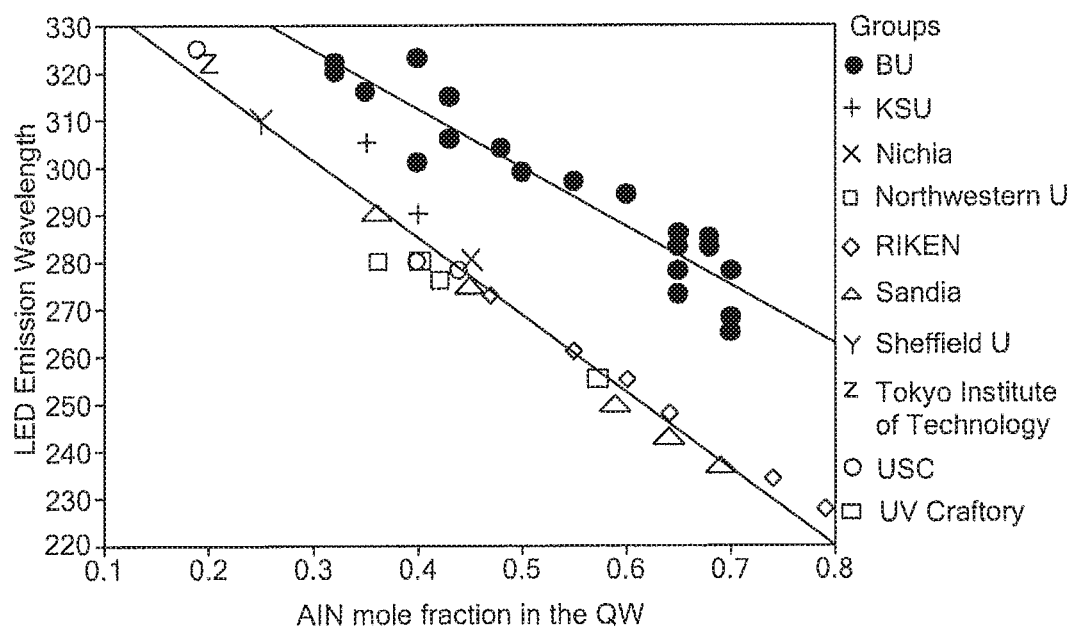
FIG. 36 shows the peak electroluminescence emission wavelength as a function of AlN mole fraction in the quantum well layers for LEDs according to the invention ("BU" solid curve, diamond symbols) compared to conventional UV LEDs made without using an excess of gallium (dashed curve, other symbols). The LEDs according to the invention display a red-shifted emission compared to conventional LEDs at the same mole fraction of AlN.
Figure 37:
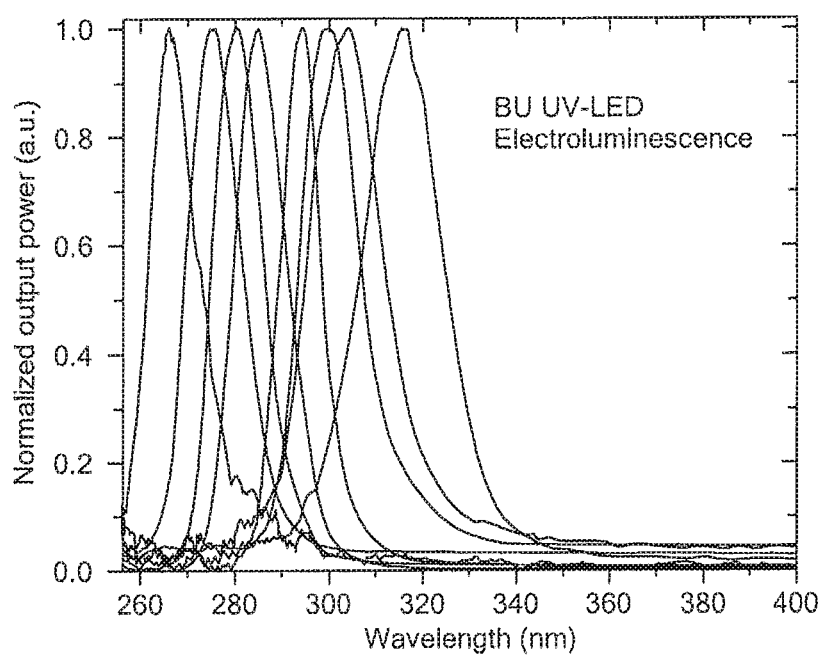
FIG. 37 shows the electroluminescence emission spectra of several UV LEDs made according to the present invention.

FIG. 36 summarizes the peak EL emission of several UV LEDs from the present investigation compared with the peak EL emission of UV LEDs from several research groups taken from the literature. The data are represented as peak emission wavelength vs. mole fraction of AlN in the quantum well. The graph clearly shows that the emission of the present UV LED devices (solid line, diamond symbols, "BU") is red shifted compared to standard UV LEDs (dashed line, other symbols), made without using excess Ga conditions (i.e., using stoichiometric conditions) for growing the AlGaN quantum well layer. The LEDs of the present invention have an EL emission that is red shifted by at least about 20 nm over the entire range of AlN mole fraction. This effect is due to the presence of band structure potential fluctuations caused by using excess Ga growth conditions. The data for standard UV LEDs was taken from the published literature (KSU=[Kim et al., 2004]; Nichia=[Fujioka et al., 2010]; Riken=[Hirayama et al., 2008] and [Hirayama et al., 2009]; Sandia=[Allerman et al., 2004]; Tokio Institute of Technology=[Kawasaki et al., 2006]; USC=[Zhang et al., 2002], [Chitnis et al., 2003], and [Zhang et al., 2004]; and UV Craftory=[Pernot et al., 2010]).

REFERENCE LIST

[Adivarahan, 2009] V. Adivarahan, A. Heidari, B. Zhang, Q. Fareed, M. Islam, S. Hwang, K. Balakrishnan, and A. Khan, Appl. Phys. Express 2, 092102 (2009).
[Adivarahan, 2004] V. Adivarahan, S. Wu, W. H. Sun, V. Mandeville, M. S. Shatalov, G. Simin, J. W. Yang, H. P. Maruska, and M. Asif Khan, Appl. Phys. Lett. 85, 1838 (2004).
[Allerman, 2004] A. Allerman, M. Crawford, A. Fischer, K. Bogart, S. Lee, D. Follstaedt, P. Provencio, and D. Koleske, J. Crys. Growth 272, 227 (2004).
[Chitnis, 2003] A. Chitnis, J. Zhang, V. Adivarahan, M. Shatalov, S. Wu, R. Pachipulusu, V. Mandavilli, and M. Khan, Appl. Phys. Lett. 82, 2565 (2003).
[Fujioka, 2010] A. Fujioka, T. Misaki, T. Murayama, Y. Narukawa, and T. Mukai, Appl. Phys. Express 2, 041001 (2010).
[Hirayama, 2008] H. Hirayama, T. Yatabe, N. Noguchi, and N. Kamata, J. Light & Vis. Env. 32, 79 (2008).
[Hirayama, 2009] H. Hirayama, S. Fujikawa, N. Noguchi, J. Norimatsu, and T. Takano, Phys. Stat. Sol. (a) 206, 1176 (2009).
[Kawasaki, 2006] K. Kawasaki, C. Koike, Y. Aoyagi, and M. Takeuchi, Appl. Phys. Lett. 89, 261114 (2006).
[Khan, 2008] A. Khan, K. Balakrishnan, and T. Katona, Nat. Photonics 2, 77 (2008).
[Kim, 2004] K. H. Kim, Z. Y. Fan, M. Khizar, M. L. Nakarmi, J. Y. Lin, and H. X. Jiang, Appl. Phys. Lett. 85, 4777 (2004).
[Nikishin, 2008] S. Nikishin, B. Borisov, V. Kuryatkov, M. Holtz, G. A. Garrett, W. L. Sarney, A. V. Sampath, H. Shen, M. Wraback, A. Usikov, and V. Dmitriev, J Mater Sci: Mater Electron 19, 764 (2008).
[Pernot, 2010] C. Pernot, M. Kim, S. Fukahori, T. Inazu, T. Fujita, Y. Nagasawa, A. Hirano, M. Ippommatsu, M. Iwaya, S. Kamayama, I. Akasaki, and H. Amano, Appl. Phys. Express 3, 061004 (2010).
[Zhang, 2002] J. Zhang, A. Chitnis, V. Adivarahan, S. Wu, V. Mandavilli, R. Pachipulusu, M. Shatalov, G. Simin, J. Yang, and M. Khan, Appl. Phys. Lett. 81, 4910 (2002).
[Zhang, 2004] J. Zhang, X. Hu, Y. Bilenko, J. Deng, A. Lunev, M. Shur, R. Gaska, M. Shatalov, J. Yang, and M. Khan, Appl. Phys. Lett. 85, 5532 (2004).
[Zhou, 2006] L. Zhou, J. E. Epler, M. R. Krames, W. Goetz, M. Gherasimova, Z. Ren, J. Han, M. Kneissl, and N. M. Johnson, Appl. Phys. Lett. 89, 241113 (2006).

That which is claimed is:

1. A device comprising:
an active layer disposed between an n-type region and a p-type region, wherein the active layer is a quantum well (QW) active layer, the active layer is undoped, and the active layer has a first AlN mole fraction and a first band gap; and
an undoped barrier layer disposed between the active layer and the n-type region and in direct contact with the active layer and the n-type region, wherein the barrier layer has a second AlN mole fraction and a second band gap,
wherein the barrier layer is configured such that electrons are injected from the n-type region into the active layer by tunneling through the barrier layer,
wherein the n-type region comprises: a first layer having a third AlN mole fraction and a third band gap; a second layer having a fourth AlN mole fraction and a fourth band gap, wherein the first layer is disposed between the barrier layer and the second layer; and a third layer directly adjacent the second layer, the third layer having a fifth AlN mole fraction and a fifth band gap,
wherein the fourth AlN mole fraction of the second layer is larger than the second AlN mole fraction of the barrier layer, the second AlN mole fraction of the barrier layer is larger than the first AlN mole fraction of the active layer, the first AlN mole fraction of the active layer is larger than the third AlN mole fraction of the first layer, and the first AlN mole fraction of the active layer is larger than the fifth AlN mole fraction of the third layer, wherein the fourth band gap of the second layer is larger than the second band gap of the barrier layer, the second band gap of the barrier layer is larger than the first band gap of the active layer, the first band gap of the active layer is larger than the third band gap of the first layer, and the first band gap of the active layer is larger than the fifth band gap of the third layer, wherein electrons in the first layer tunnel through the barrier layer into the active layer when the device is energized, and wherein electrons in the third layer tunnel through the second layer into the first layer when the device is energized.

2. The device of claim 1 wherein the active layer, the barrier layer, the first layer, and the second layer are AlGaN.

3. The device of claim 1 wherein the active layer emits ultraviolet radiation.

4. The device of claim 1:
wherein the active layer emits ultraviolet radiation in a wavelength range between 210 nm and 360 nm.

5. The device of claim 1 wherein the active layer has an average aluminum concentration and an average gallium concentration across a total lateral extent of the active layer, and a reduced aluminum concentration and a greater gallium concentration as compared to the average aluminum concentration and the average gallium concentration in a localized region, the localized region having a lateral extent that is less than the total lateral extent of the active layer.

6. The device of claim 1 wherein the active layer is non-faceted.

7. The device of claim 1 wherein the active layer emits radiation having a peak wavelength less than 350 nm.

8. The device of claim 1 wherein the n-type region consists entirely of the first layer, the second layer, and the third layer.

9. The device of claim 1 wherein the barrier layer is a first barrier layer, the device further comprising a second barrier layer, the second barrier layer being an undoped layer,
wherein the second barrier layer has a sixth AlN mole fraction less than the fourth AlN mole fraction of the second layer,
wherein the second barrier layer has a sixth band gap less than the fourth band gap of the second layer, and
wherein the sixth AlN mole fraction and the sixth band gap of the second barrier layer is greater than the first AlN mole fraction and the first band gap of the active layer.

10. The device of claim 9, wherein the active layer is between and directly adjacent the first barrier layer and the second barrier layer.

* * * * *